(12) United States Patent
Jennion et al.

(10) Patent No.: US 6,760,904 B1
(45) Date of Patent: Jul. 6, 2004

(54) APPARATUS AND METHODS FOR TRANSLATING TEST VECTORS

(75) Inventors: Mark W. Jennion, Chester Springs, PA (US); Oleg Rodionov, Philadelphia, PA (US)

(73) Assignee: Unisys Corporation, Blue Bell, PA (US)

( * ) Notice: Subject to any disclaimer, the term of this patent is extended or adjusted under 35 U.S.C. 154(b) by 0 days.

(21) Appl. No.: 09/389,281

(22) Filed: Sep. 2, 1999

(51) Int. Cl.[7] .............................................. G06F 9/45

(52) U.S. Cl. ..................... 717/137; 717/136; 717/138; 717/139; 703/28; 714/734; 714/742

(58) Field of Search ................................ 717/124–138, 717/123; 714/734, 733–735, 741–742; 703/13–15, 28

(56) References Cited

U.S. PATENT DOCUMENTS

| | | | |
|---|---|---|---|
| 4,689,791 A | 8/1987 | Ciuciu et al. .................. | 371/27 |
| 5,046,033 A | 9/1991 | Andreasen et al. .......... | 364/580 |
| 5,446,742 A | 8/1995 | Vahabi et al. ................. | 371/27 |
| 5,581,491 A | 12/1996 | Biwer et al. ................. | 364/580 |
| 5,644,581 A | 7/1997 | Wu ............................. | 371/27 |
| 5,668,745 A | 9/1997 | Day ............................ | 364/580 |
| 5,715,387 A | 2/1998 | Barnstijn et al. ...... | 395/183.14 |
| 5,774,358 A | 6/1998 | Shrote ........................ | 364/191 |
| 5,778,004 A | 7/1998 | Jennion et al. ............. | 371/22.1 |
| 5,819,067 A | 10/1998 | Lynch ........................ | 395/500 |
| 5,828,985 A | 10/1998 | Sauer et al. ................. | 702/122 |
| 5,875,336 A | 2/1999 | Dickol et al. ............... | 395/705 |
| 6,067,652 A | * 5/2000 | Fusco et al. ................. | 714/741 |

OTHER PUBLICATIONS

T. Greer and Z. Sekulic, "Probing 'Cavity Down' Devices, Test Solutions", pp. 1–8, Winter 1993.
Fast and Precise IC Characterization and Test HP82000 IC Evaluation System, HewlettPackard GmbH, Germany, 1990.
K. Hird, K. Parker, B. Follis, "Test Coverage: What Does It Mean When a Board Test Passes?", Paper 37.2, pp. 1066–1074, ITC International Test Conference, IEEE, 2002.
M. Robbins, "In–Circuit Testing", EPP, Dec. 2000, pp. 36–42.
HewlettPackard—ASIC/IC Evaluation Seminars—Dec. 4–6, 1991.

* cited by examiner

Primary Examiner—Tuan Dam
Assistant Examiner—Ted T. Vo
(74) Attorney, Agent, or Firm—Michael B. Atlass; Mark T. Starr; Woodcock Washburn

(57) ABSTRACT

Apparatus and methods for translating test vectors between a format suitable for use with a standalone integrated circuit tester and a format suitable for use with an in-circuit tester are disclosed. Methods according to the invention include: providing a first test file in a first format that is suitable for use with the standalone integrated circuit tester, and translating the first test file into a second test file in a second format that is suitable for use with the in-circuit tester. Methods according to the invention also include: providing a first test file in a first format that is suitable for use with the in-circuit tester, and translating the first test file into a second test file in a second format that is suitable for use with the standalone integrated circuit tester. Apparatus according to the invention include computer-readable media having stored thereon computer-executable instructions for performing these methods.

16 Claims, 15 Drawing Sheets

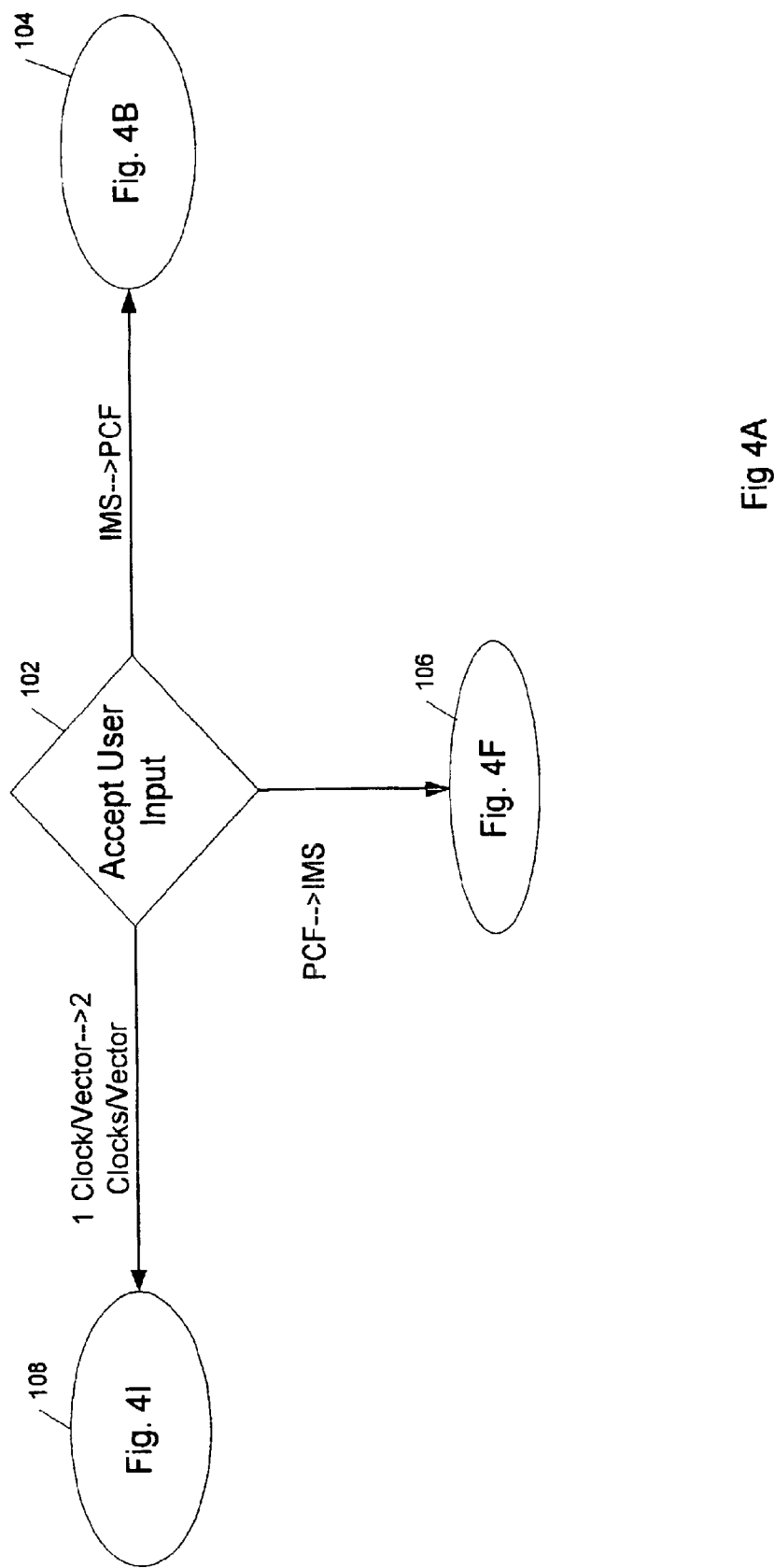

APPARATUS AND METHODS FOR TRANSLATING TEST VECTORS

FIELD OF THE INVENTION

The present invention relates generally to integrated circuit (IC) testing. More particularly, the present invention relates to translating test vectors from a first format suitable for use with a standalone IC tester into a second format suitable for use with an in-circuit tester, and vice versa.

BACKGROUND OF THE INVENTION

During design and development, ICs, such as application specific ICs (ASICs), field programmable gate arrays (FPGAs), and so on, are routinely subjected to a series of tests, including standalone chip tests and in-circuit tests. A chip test typically tests all the logic within an individual IC using an input set of test vectors in a format suitable for use by the chip tester. One known chip tester is the Logic Master XL60, which is available from Integrated Measurement Systems. This tester uses, as input, a test file including test vectors in a proprietary format.

An in-circuit tester tests a completed printed circuit board assembly, which typically includes one or more ICs. The purpose of in-circuit testing is to verify that the assembly is free of manufacturing defects, such as solder shorts or opens, incorrect components, misoriented components, and so on. A typical in-circuit test assumes that the individual components that make up the assembly are defect free. The in-circuit tester uses a second set of test vectors in a format that differs, sometimes significantly, from the format of the test vectors used during chip testing. One such example is Hewlett-Packard Company's pattern conversion format (PCF).

In-circuit testing is also commonly referred to as 'bed-of-nails' testing. These nails make physical contact with routing traces on the printed circuit board, and can be used to drive stimuli to devices under test, and to receive responses to verify that all the device connections have been made. Typically, the stimuli used to test these device connections are generated programmatically from one of three types of files: 1) a device model for simple devices; 2) boundary scan device logic (BSDL) for large complicated devices with design-for-test; or 3) a device netlist for programmable devices. In all three cases an additional file that represents the printed circuit boards's topology or connection order is used to generate tests for each device.

The process described above is a common way to generate in-circuit tests for such devices. In some cases, however, the necessary inputs do not exist. For example, older chips that were designed before boundary scan was popular were too complicated to be represented by a model, and most likely used a non-standard netlist format. Quite often, modern designs have this same problem, as short cuts are taken to save time or money. Generating in-circuit tests for these devices has posed a unique challenge. In many cases the solution has been simply not to test the device once the assembly is complete. Obviously, this can create reliability and system test yield problems.

Typically, millions of test vectors must be developed to test an IC at the chip test level. Many thousands of these represent connections that will be tested again during in-circuit testing. Consequently, once a chip test has been successfully conducted, and the test vectors have been proven, it would be desirable to reuse as much as possible of this subset of test vectors in conducting the in-circuit test. Because of the very different formats required by the above-described chip test and in-circuit test tools, however, this subset is frequently unusable. Similarly, if an in-circuit test fails, it is sometimes necessary to verify that the test vectors being used for the in-circuit test are accurate. Under such circumstances, it would be desirable to use the in-circuit test vectors in a standalone chip test to determine whether the fault is due to the chip, or to the in-circuit test vectors. Again, due to the varying formats of the two sets of test vectors, the in-circuit test vectors frequently cannot be used in the chip test environment.

U.S. Pat. No. 5,778,004, issued in the names of Jennion, et al. ("Jennion '004"), discloses an IC test environment which includes at least two test configurations where each test configuration employs a different test vector format. Jennion '004 discloses apparatus and methods for translating a first set of test vectors having a first format used in a first test configuration into a second set of test vectors in a second format to be used in a second test configuration. The system disclosed therein includes means for receiving user selections representing at least one of a desired set of signals and a desired range of test vectors to be processed from the first set of test vectors; means for extracting data related to the user selections from the first set of test vectors; and means for converting the extracted data into the second set of test vectors in the second format.

The prior art does not seem to disclose a vector translator that provides a method for translating test vectors from a format suitable for use with a chip tester (such as the XL60 format) into a format suitable for use with an in-circuit tester, and vice versa. Thus, there is a need in the art for such a vector translator.

SUMMARY OF THE INVENTION

The present invention satisfies these needs in the art by providing apparatus and methods for translating test vectors from a format suitable for use with a chip tester into a format suitable for use with an in-circuit tester, as well as apparatus and methods for translating test vectors from a format suitable for use with an in-circuit tester into a format suitable for use with a chip tester.

Methods for translating test vectors from a format suitable for use with an integrated circuit tester into a format suitable for use with an in-circuit tester include providing a first test file in a first format that is suitable for use with the integrated circuit tester for standalone testing of an integrated circuit. The first test file is then translated into a second test file in a second format. The second format is suitable for use with the in-circuit tester for in-circuit testing of the integrated circuit. Preferably, the format of the first file is IMS format and file includes a set of test vectors for standalone testing of the integrated circuit, as well as a set of pin definitions that define pins of the integrated circuit. The format of the second file is preferably PCF.

The first test file can be provided, at least in part, by providing a complete test file that includes test vectors for testing logic within the integrated circuit, and selecting a subset of the test vectors included in the complete test file. The selected subset can then be included in the first test file. The first test file can be translated into the second test file by identifying in the first file test vector data in the first format, and writing to the second file test vector data in the second format that corresponds to the test vector data in the first format. The translation can also include identifying in the first file pin information in the first format. Based on the pin information, pin assignment statements, pin definitions, and pin functionality statements can be written to the second file in the second format.

Similarly, methods for translating test vectors from a format suitable for use with an in-circuit tester into a format suitable for use with an integrated circuit tester include providing a first test file in a first format that is suitable for use with the in-circuit tester for in-circuit testing of an integrated circuit. The first test file is then translated into a second test file in a second format. The second format is suitable for use with the integrated circuit tester for standalone testing of the integrated circuit. Preferably, the first file is in PCF, and the second file is in IMS format.

Apparatus according to the invention include computer-readable media having stored thereon computer-executable instructions for performing these methods.

The methods and apparatus of the present invention can be used in a test evaluation method to verify that a device being subjected to an in-circuit test is not flawed. The test evaluation method comprises performing an in-circuit test on a device under test (DUT) using an in-circuit test file in a format suitable for input into an in-circuit tester. If the DUT fails the in-circuit test, then the in-circuit test file is translated into an integrated circuit test file in a format that is suitable for input into a standalone integrated circuit tester. A standalone integrated circuit test is performed on a golden device using the integrated circuit test file. A golden device is a device of the kind under test that has been proven to work properly. If the golden device passes the standalone integrated circuit test, then it can be reasonably concluded that the DUT is not flawed. The invention thus provides a mechanism for verifying (with a reasonable degree of certainty) that a DUT is not flawed despite the fact that it may have failed an in-circuit test. This could indicate that, for example, the circuit board itself is flawed. Other aspects of the present invention are described below. If the golden device fails the standalone integrated circuit test, then it can be reasonably concluded that the in-circuit test file is flawed, or that the in-circuit test file introduced certain tests that were not conducted during previous standalone integrated circuit testing on the golden device.

BRIEF DESCRIPTION OF THE DRAWINGS

The foregoing summary, as well as the following detailed description of the preferred embodiments, is better understood when read in conjunction with the appended drawings. For the purpose of illustrating the invention, there is shown in the drawings an embodiment that is presently preferred, it being understood, however, that the invention is not limited to the specific apparatus and methods disclosed.

FIGS. 4A–4J provide a flowchart of a presently preferred process in accordance with the present invention.

DETAILED DESCRIPTION OF PREFERRED EMBODIMENTS

Overview

Figure 1:
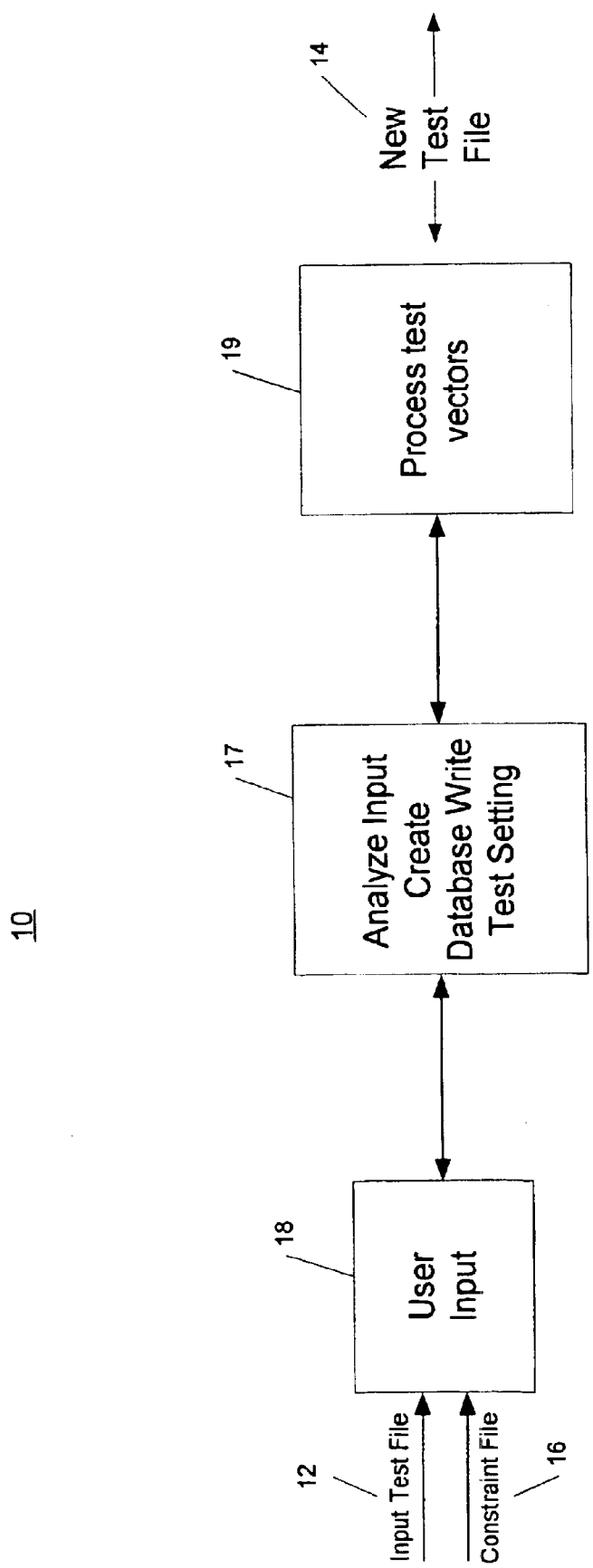
FIG. 1 is a high level flow diagram of a presently preferred embodiment of the invention.

The present invention provides apparatus and methods for translating test vectors from a format suitable for use with a chip tester (such as, for example, the XL60 tester) into a format suitable for use with an in-circuit tester (for example, the HP tester) and vice versa. In the case of chip tests, the test vectors can be verified initially against a so-called "golden device," i.e., a device of the kind under test that has been proven to work properly. These proven vectors then can be converted into a format suitable for in-circuit test execution. Conversely, an existing in-circuit test for a particular device can be extracted and converted into a chip level test.

For purposes of the following description, the test vector format suitable for use with the chip tester will be referred to as "IMS format," while the test vector format suitable for use with the in-circuit tester will be referred to as "PCF." It should be understood, however, that the present invention is equally applicable to test configurations using other test vector formats.

An exemplary IMS input file is included as Appendix A hereof. As shown, the exemplary IMS file includes a set of configuration statements (shown as "Config" in Appendix A) that describe the resources available on the test platform (e.g., data cards). Preferably, the file also includes a set of resource statements (shown as "Resource" in Appendix A). The resource statements assign specific tester resources to specific input/output pins of the device under test. Note that, in IMS format, "force" refers to a tester resource that sends data to an input pin of the device under test. Conversely, "compare" refers to a tester resource that receives data from an output pin of the device under test, and compares the received data against expected data. If the received data differs from the expected data, an error is flagged. The IMS test file also includes a set of test vectors. For each signal name provided in the resource statements, there should be a corresponding column of data in each test vector. In the exemplary file shown in Appendix A, as one reads down the list of resource statements, one can locate the corresponding data columns by moving left to right in the vectors. If the device signal or pin is input only, a 1 or 0 is provided in the column corresponding to that pin. Data shown as "z" in Appendix A represents an "input don't care," i.e., no specific input signal needs to be sent to this pin. Typically, this is used for bi-directional pins where the input is irrelevant to the test. Finally, data shown as "x" in Appendix A represents a "compare don't care," i.e., the pin's output value is irrelevant to the test.

An exemplary PCF input file is included as Appendix B hereof. As shown, the exemplary PCF file includes a set of assignment statements (shown as "assign" in Appendix B). The assign statements assign specific tester resources to specific input/output pins of the device under test. Preferably, the PCF file also includes one or more data order statements (shown as "pcf_order" in Appendix B). The data order statement defines the structure of the columns of the test vectors that follow. Each test vector includes the actual data corresponding to the device as shown in the pcf_order satement. That is, as one reads across the resources provided in the pcf_order statement, one also reads across the test vectors to determine the actual datum corresponding to that resource. The notations "1," "0," "z," and "x" represent the same data as discussed above in connection with the IMS test file.

The present invention is useful in several ways. First, it provides a user with a convenient way to create in-circuit tests on a chip tester such as the LogicMaster XL60. It is much easier for a developer to create and debug a test for a stand-alone device than it is to create the test for a device mounted in the board. Second, the invention is useful for debugging non-working in-circuit tests, since it allows a user to isolate a certain failing device and then to test it independently from the board to find the cause of a problem.

Preferably, the present invention is implemented in software, in the C programming language. The program can be stored as a set of computer executable instructions on a disk or any other computer readable data storage medium, from which the program can be downloaded or executed. It should be understood, however, that the invention is in no way limited to a software program, nor is its implementation limited to a "C" program.

A high level flow diagram of a preferred embodiment of the present invention is illustrated in FIG. 1. The program 10 can accept either IMS or PCF test files as input, and produces either PCF or IMS test files, respectively, as output. The input "Test File" 12 and the output "New Test File" 14 can be in either of the two formats, depending on which direction is desired. The in-circuit test platform supplies the "Constraint File" 16, which describes tester resources and how tester drivers are allocated. Each of these files is described in greater detail below in connection with FIGS. 4A–4J.

The program 10 also accepts user input 18, and then preprocesses input data from Test File 12, Constraint File 16, and user input 18. As shown in block 17, the program extracts data, such as device settings, pin names, and pin data, from the test file, and creates an internal database to store the extracted data. After the database is created, the program writes the settings information to New Test File 14. As shown in block 19, the program uses the database to translate the input test vectors into the desired format by converting from 1 vector/clock to 2 vectors/clock, if necessary, and then writing the translated vectors to New Test File 14. Sometimes, it is necessary to convert the vectors from 1 vector/clock to 2 vectors/clock, because IMS automatically understands whether one or two vectors per clock is required, while, in PCF, it must be specifically indicated whether one or two vectors per clock is required.

Exemplary Test Environment

Figure 2A:
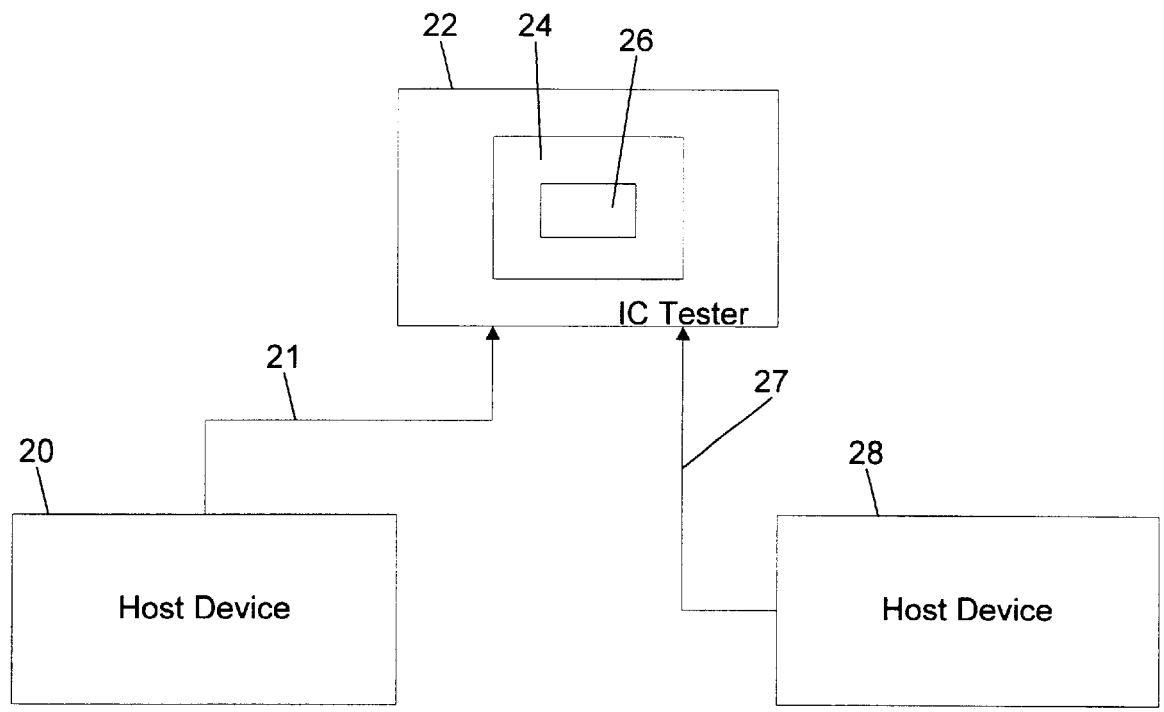
FIGS. 2A and 2B depict an exemplary hybrid test environment for which the apparatus and methods of the present invention are particularly suitable.
Figure 2B:
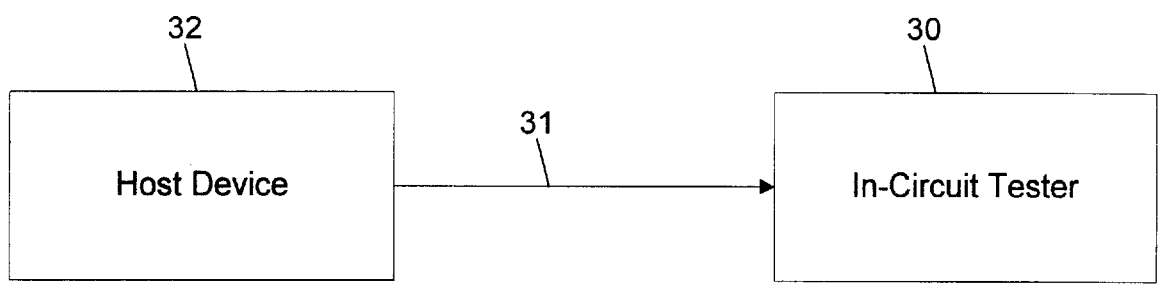

FIGS. 2A and 2B depict an exemplary hybrid test environment for which the apparatus and methods of the present invention are particularly suitable. In FIG. 2A, a chip test configuration is depicted including a host device 20, such as a personal computer (PC) or workstation, that can be used for generating vectors in IMS format for use with a chip tester 22. It should be noted that the connection 21 between host device 20 and chip tester 22 can be, for example, an Ethernet connection, a general purpose interface bus (GPIB) connection, or the like. As shown, chip tester 22 includes a circuit board 24, on which resides the IC 26 under test. Circuit board 24 provides various connections between chip tester 22 and IC 26.

In this particular illustration, a second host device 28 is connected, via a GPIB connection 27, for example, to chip tester 22. Preferably, software implemented apparatus embodying the present invention executes on host device 28, where it communicates with chip tester 22 to extract IMS vectors, process them, and produce PCF vectors. The user interface with the present invention and the extraction and processing of the IMS vectors is described in detail below.

Once the PCF vectors are produced, they are downloaded to in-circuit tester 30. In the configuration shown in FIGS. 2A and 2B, this is accomplished by storing the PCF vectors on a floppy disk (not shown), and carrying the floppy disk to a third host device 32 that is connected, via a GPIB connection 31, for example, to in-circuit tester 30. It should be understood, however, that other suitable techniques for transferring this data are also contemplated. For example, host device 28 can be connected directly to in-circuit tester 30, or via a local area network (LAN) connection to host device 32. Basically, any suitable interconnections that provide for the necessary transfer of data can be used. Once the PCF vectors are loaded onto in-circuit tester 30, the in-circuit tests can be run and, with the aid of diagnostic equipment (not shown), various signals can be monitored, captured, and/or analyzed.

It should be understood that the configuration depicted in FIGS. 2A and 2B can also be used for translating PCF vectors suitable for use with in-circuit tester 30 into IMS vectors suitable for use with chip tester 22, and for loading the output IMS file onto chip tester 22.

Figure 3A:
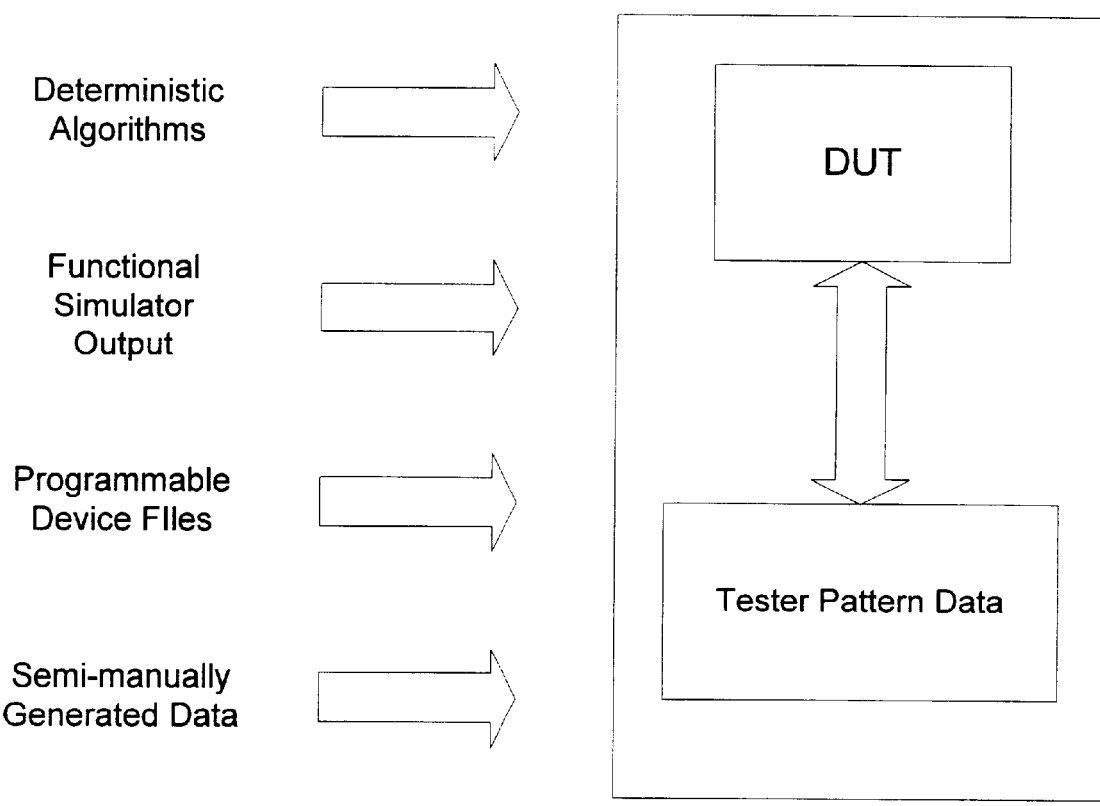
FIGS. 3A and 3B illustrate both the chip test generation process, and the in-circuit test generation process.
Figure 3B:
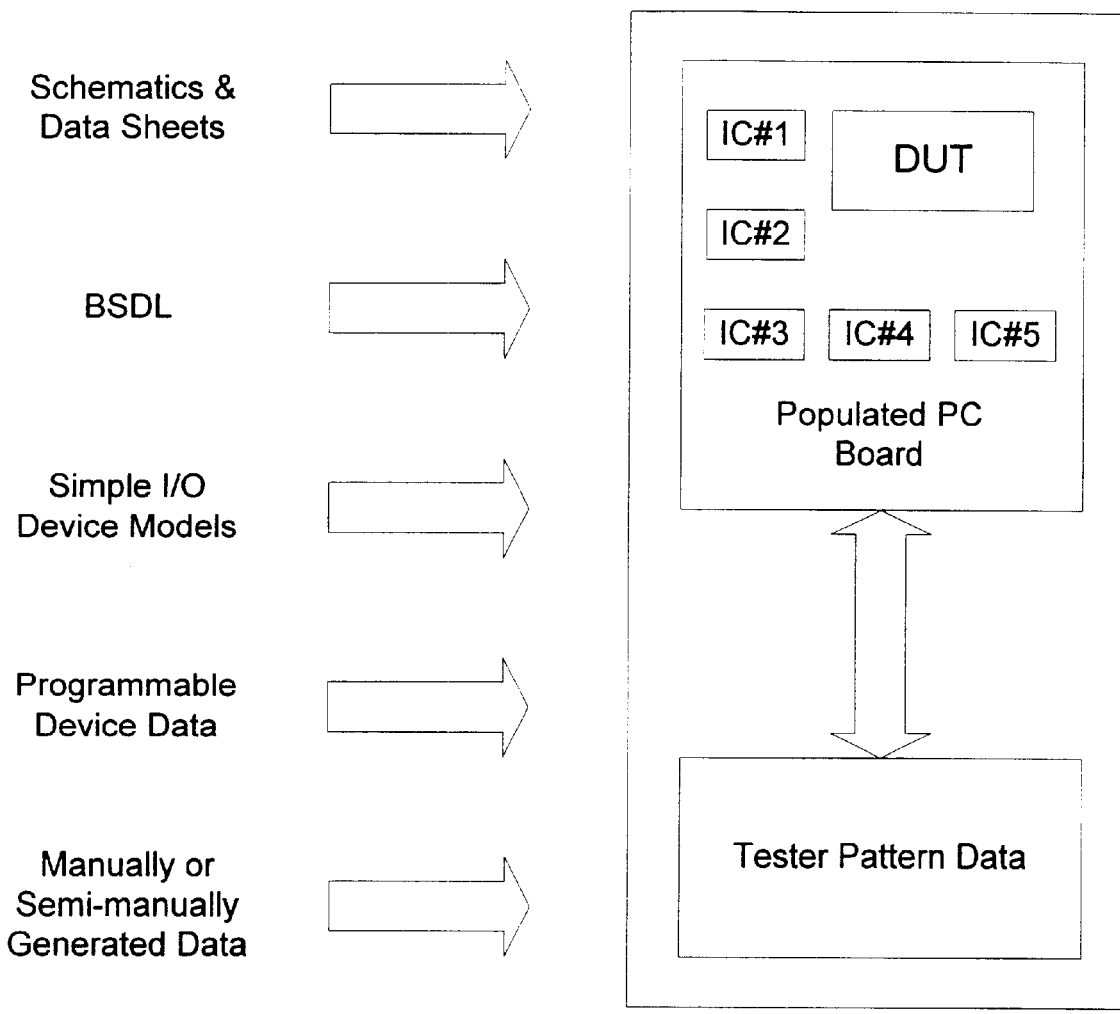

FIGS. 3A and 3B illustrate both the chip test generation process and the in-circuit test generation process. One purpose of the present invention is to bridge the gap between chip testers and in-circuit testers, thereby allowing for reuse of test data. It provides a user with a convenient way to port chip tests into the in-circuit test environment. Similarly, it allows for in-circuit tests to be converted into standalone chip tests and used on a chip tester. It is much easier for an IC test engineer to create and debug a test for a standalone device than to create the test for a device mounted in the board. When debugging a device within the in-circuit test environment, the developer should consider the effects caused by other board logic and the test environment itself. This program is particularly suitable for debugging in-circuit tests, as it allows a user to isolate a particular device and test it independently of the aforementioned complications.

The purpose of each test platform is, in general, very different. In some ways, however, they are related. Chip testers, for example, are typically expected to test all the internal logic of the device under test (DUT), looking for shorts, opens, and other defects at the sub-micron level. The amount of test data to do this is enormous for today's designs, and is very complicated to generate. An in-circuit tester looks for similar types of defects, but at a device interconnect level. It is expected to find these defects when they are introduced during the board's assembly in the manufacturing environment. This test data set is also very large and complex, as it has to account for a large number of unique devices made of different technologies with different logical design methodologies.

FIG. 3A shows possible test data origins for a chip tester. The chip tester can accept input data from deterministic algorithms, functional simulator output, programmable device files, and also semi-manually generated data. The chip tester then uses the input tester pattern data to stimulate the device under test (DUT).

Similarly, FIG. 3B shows possible test data origins for an in-circuit tester. The in-circuit tester can accept input data from schematics and data sheets, BSDL, simple I/O device models, programmable device data, and manually or semi-manually generated data. The in-circuit tester then uses the input tester pattern data to stimulate the DUT. Typically, the in-circuit tester tests a populated PC board comprising the device under test (DUT) and, in general, a plurality of additional ICs.

Methods for Translating Test Vectors

FIGS. 4A–4J provide a flowchart of a preferred embodiment of the present invention, which, as discussed above, has been implemented in software, in the C programming language. Several advantages of the present invention should be readily apparent to those skilled in the art. For example, it supplies an alternative test data origin for device designs that fall outside of the normal in-circuit test development process. Examples of this include tests to be conducted on proprietary custom ASICs or non-standard FPGAs. Second, it supports the portation of in-circuit tests to a chip test platform for verification or debug. In case of an ICT failure, this method provides an opportunity to isolate a test for a particular device and reproduce the failure in an isolated environment on the chip tester. These techniques can be invaluable in some cases and can save enormous amounts of time and resources. Third, it enables development of specific tests to supplement existing test coverage. Even when the desired test approach is taken, it is common for holes in test coverage to occur. This program provides a vehicle to increase the effective coverage of weak tests. Fourth, it is suitable for generating level 3 functional tests for some devices. That is, there are cases when in-circuit tests are required to test all the internal logic of a device within the assembly. This can be done relatively easily where functional tests already exist from a previous stage of development.

The invention provides a unique ability to take a proven chip test of any type (e.g., parametric, boundary, built-in self-test, etc.) directly from a chip tester and generate an in-circuit test. It also provides the ability to add additional device tests to increase coverage of known weak test coverage areas (either specific pins or logic areas). It provides the ability to capture non-working in-circuit tests, and to create an environment to isolate the chip from the board. This allows easy manipulation of voltage, sample and clock rate, and other parameters that cannot be easily manipulated in board environment.

Figure 4B:
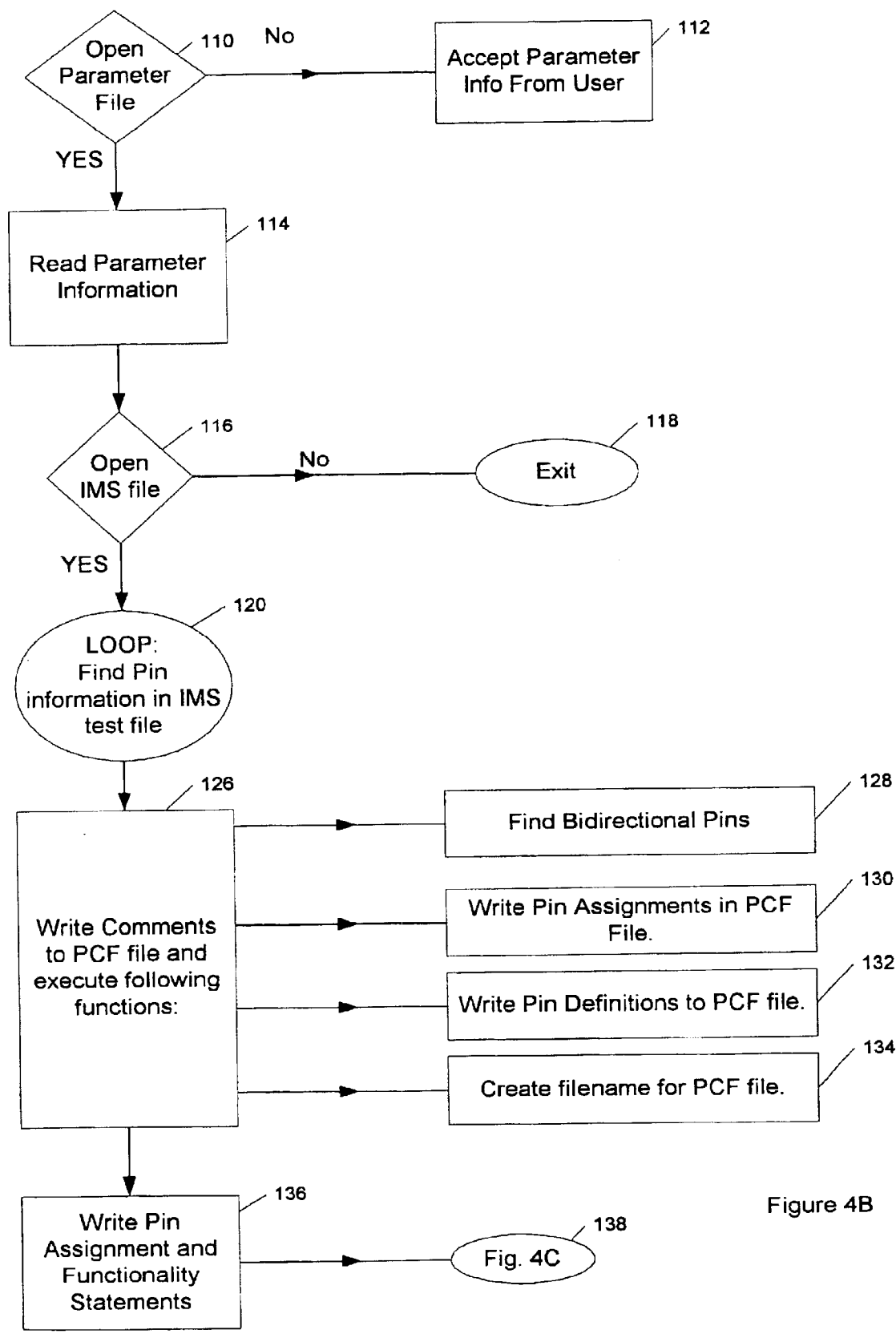
Figure 4C:
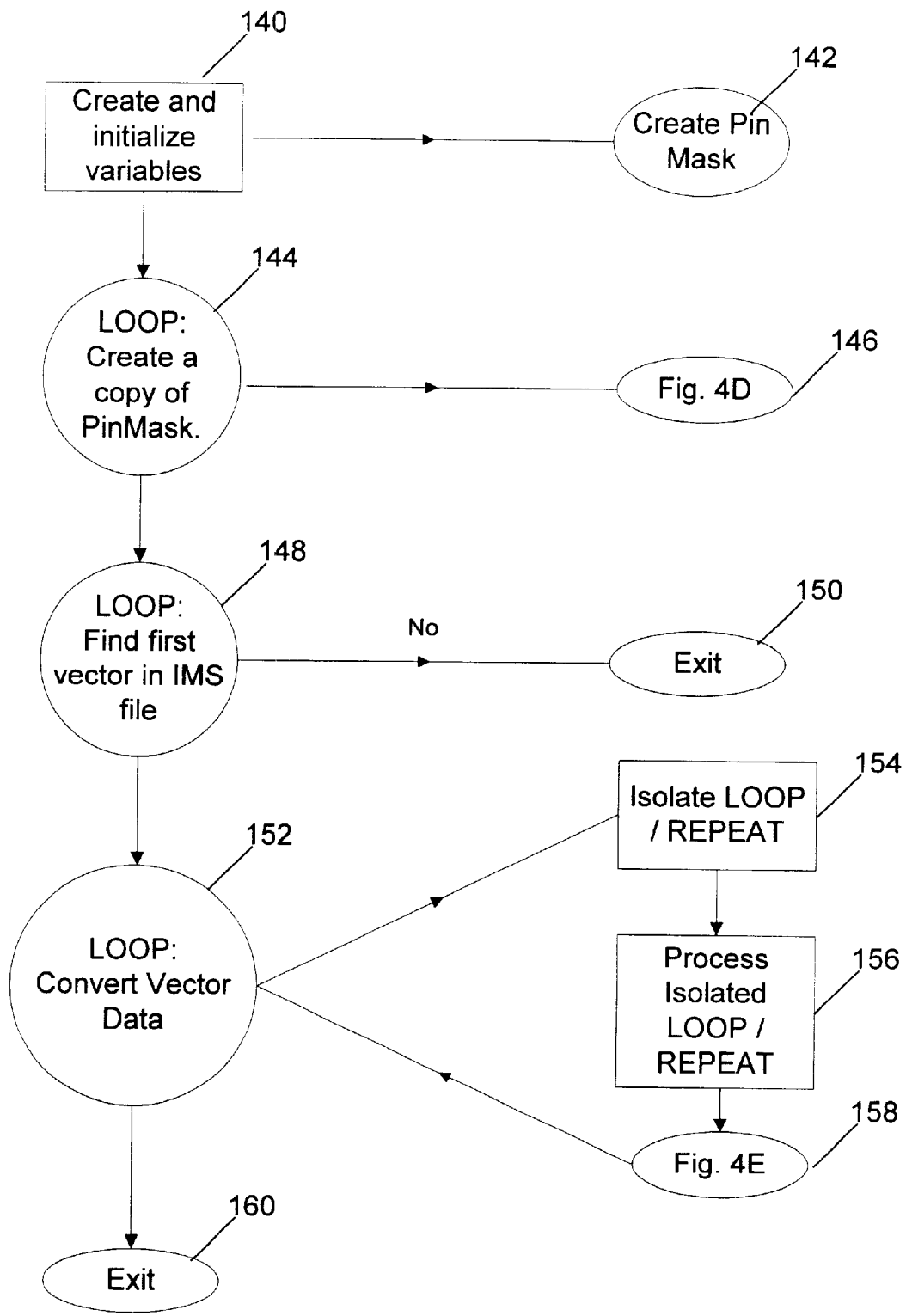
Figure 4D:
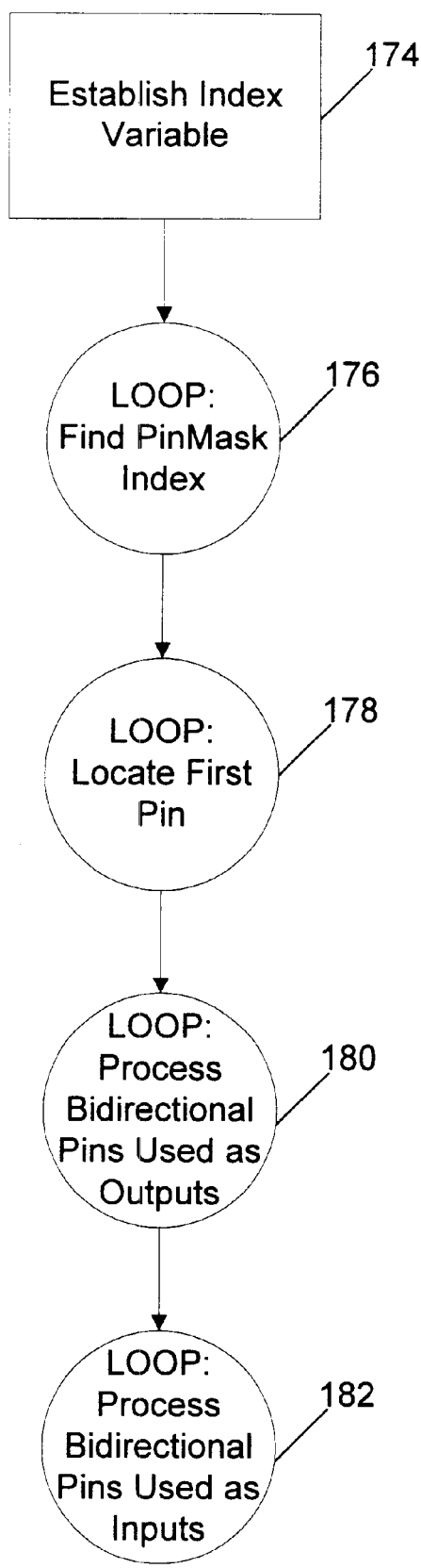

A preferred embodiment of the present invention will now be described in detail with reference to the flowcharts shown in FIGS. 4A–4J. As shown in FIG. 4A, at step 102, the program initially presents a user with a user interface via which the user can identify the type of conversion the program is to perform. If, at step 102, the user elects to convert an IMS file to PCF, the program performs the conversion at step 104. FIGS. 4B–4E provide a detailed flowchart of a method for converting IMS files to PCF. The user can also choose, at step 102, to convert a PCF file to IMS. If the user selects this option, the program performs the conversion at step 106. FIGS. 4F–4H provide a detailed flowchart of a method for converting PCF files to IMS. In some instances (e.g., during test debug), the user might wish to convert the test vectors from 1 clock/vector to 2 clocks/vector. The user can select this option, at step 102, in which case the program will perform this conversion at step 108. FIGS. 4I and 4J provide a detailed flowchart of a method for converting test vectors from 1 clock/vector to 2 clocks/vector.

Translation of IMS vectors to PCF

FIGS. 4B–4E provide a detailed flowchart of a method for converting IMS files to PCF. An exemplary IMS input file is included as Appendix A hereof. First, a parameter file is opened at step 110. Preferably, the parameter file includes predefined pin information such as a generic name for the pin, an IMS resource name, a package name, and so on. If the parameter file is missing, the user is prompted at step 112 to input the required parameter information. Otherwise, the parameter information is read from the file at step 114. Once the parameter information is obtained, the IMS file that is to be translated into PCF is opened at step 116. If the IMS file cannot be found, or cannot be opened for any reason, the program exits at step 118.

If the IMS file is opened at step 116, the program loops through the IMS file, at step 120, to find and extract the relevant pin information. The pin information is stored in the IMS file as four word strings. Thus, the first step in loop 120 is to divide the string into four words, and then to read the resource information from the IMS file. The resource information is stored in an appropriate data structure.

If any comments are to be written to the PCF file, they are written at step 126. Thereafter, a number of functions are performed to generate the required data in the PCF file. At step 128, bidirectional pins are found by searching for pins defined twice (i.e., as both "force" and "compare"). This information is then stored in a two-dimensional array called a "group mask." At step 130, assignment statements are written to the PCF file. The information in the group mask is used to ensure that bidirectional pins are assigned only once. Preferably, the power pin is not assigned because, in a preferred embodiment, the user provides this assignment.

At step 132, the pin definitions are written to the PCF file. At this point, strings are created that list all groups of the same type (i.e., Input, Output, Bidirectional, and Nondigital groups. First, all "Force" (i.e., input) groups are listed in an input buffer string. Next, all "Compare" (i.e., output) groups are listed in an output buffer string. Third, all "Nondigital" (i.e., unused) groups are listed in a nondigital string buffer and, finally, all "Bidirectional" groups are listed in a bidirectional string buffer.

At step 134, a filename is created for the PCF test file, preferably by changing the extension of the input filename from "*.tst" to "*.pcf." Pin assignment statements and pin functionality statements are written to the output PCF file at step 136. The pin functionality statements include whether the pin is an input pin, an output pin, or a bidirectional pin.

Finally, at step 138, the data is converted. FIG. 4C provides a detailed flowchart for converting the data. First, program variables are created and initialized at step 140. At step 142, a pin mask is created to store certain information in a two-dimensional array. Preferably, the pin mask includes pin type, i.e., whether the pin is input (force), output (compare), bidirectional, or nondigital. The pin mask also preferably includes a pointer to group information in the group mask, and an indicator of the total number of pins in the current group.

A copy of the pin mask is then created at step 144. This allows the pin mask to be changed, and then returned to its original state for every vector. At step 146, the formatting of bidirectional pins in IMS is addressed. FIG. 4D provides a detailed flowchart for formatting bidirectional pins in IMS. In PCF, pins can be defined as bidirectional, while in IMS format, pins can be only "force" (i.e., input), or "compare" (i.e., output). This function locates each bidirectional pin and determines whether, for the current test, the pin is being used as an input pin or an output pin. At step 174, an index variable for the current pin is established. An index is needed to access information about current pin in the pin mask. At step 176, the pin mask index is found for the first pin in the bidirectional group (i.e., compare group if this is force, and force if this is compare). The pin is located at step 178. At step 180, for bidirectional pins used as outputs, only the Compare Group is written to the output test file, while the Force Group is ignored. Similarly, at step 182, for bidirectional pins used as inputs, only the Force Group is written, while the Compare Group is ignored.

Returning to FIG. 4C, at step 148, the first vector in the IMS file is found. If no vector is found, then the program exits at step 150. If the first vector is found at step 148, then, at step 152, the program loops through the IMS file to perform the appropriate conversion, according to the information stored in the pin mask, for every character of every IMS vector. For each vector, any LOOP or REPEAT instructions or comments are isolated at step 154. LOOP or REPEAT instructions or comments indicate the number of times to execute a loop. At step 156, isolated instructions are executed, while isolated comments are placed in a comment field at the end of the corresponding PCF vector. At step 158, the PCF vector is written to the output PCF file.

Figure 4E:
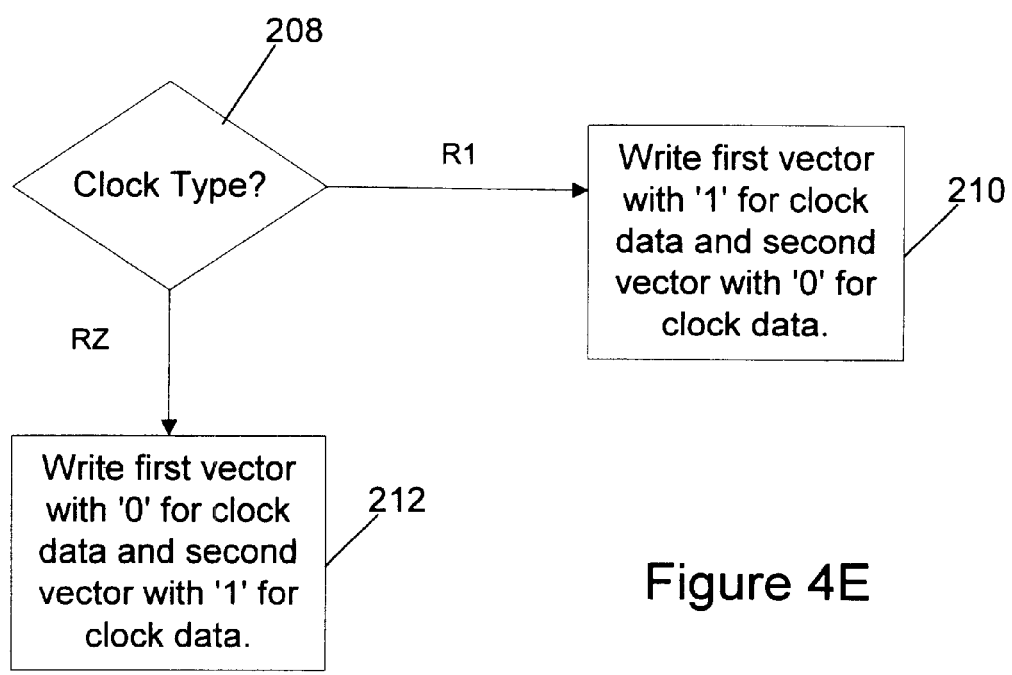
Figure 4F:
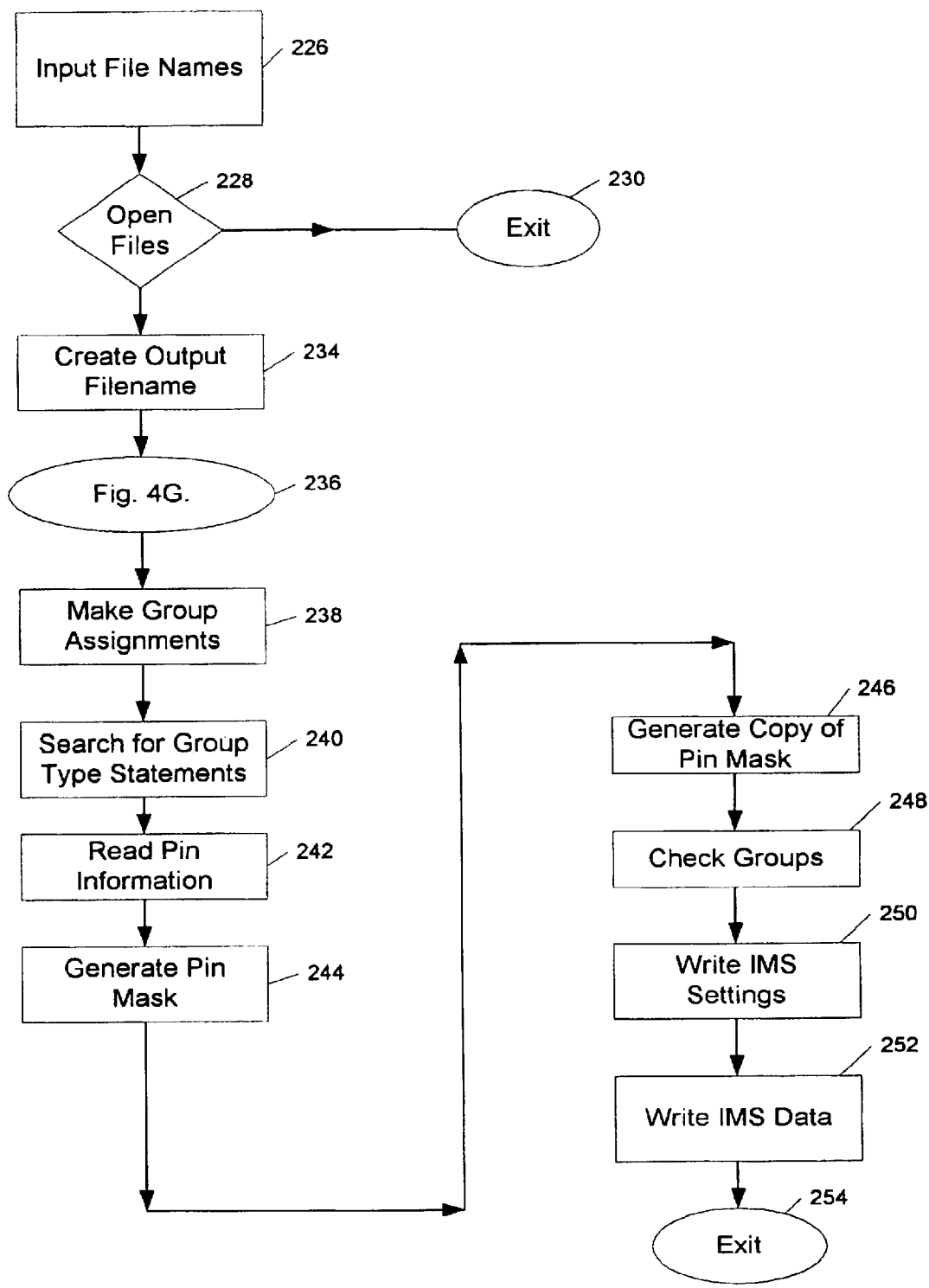
Figure 4G:
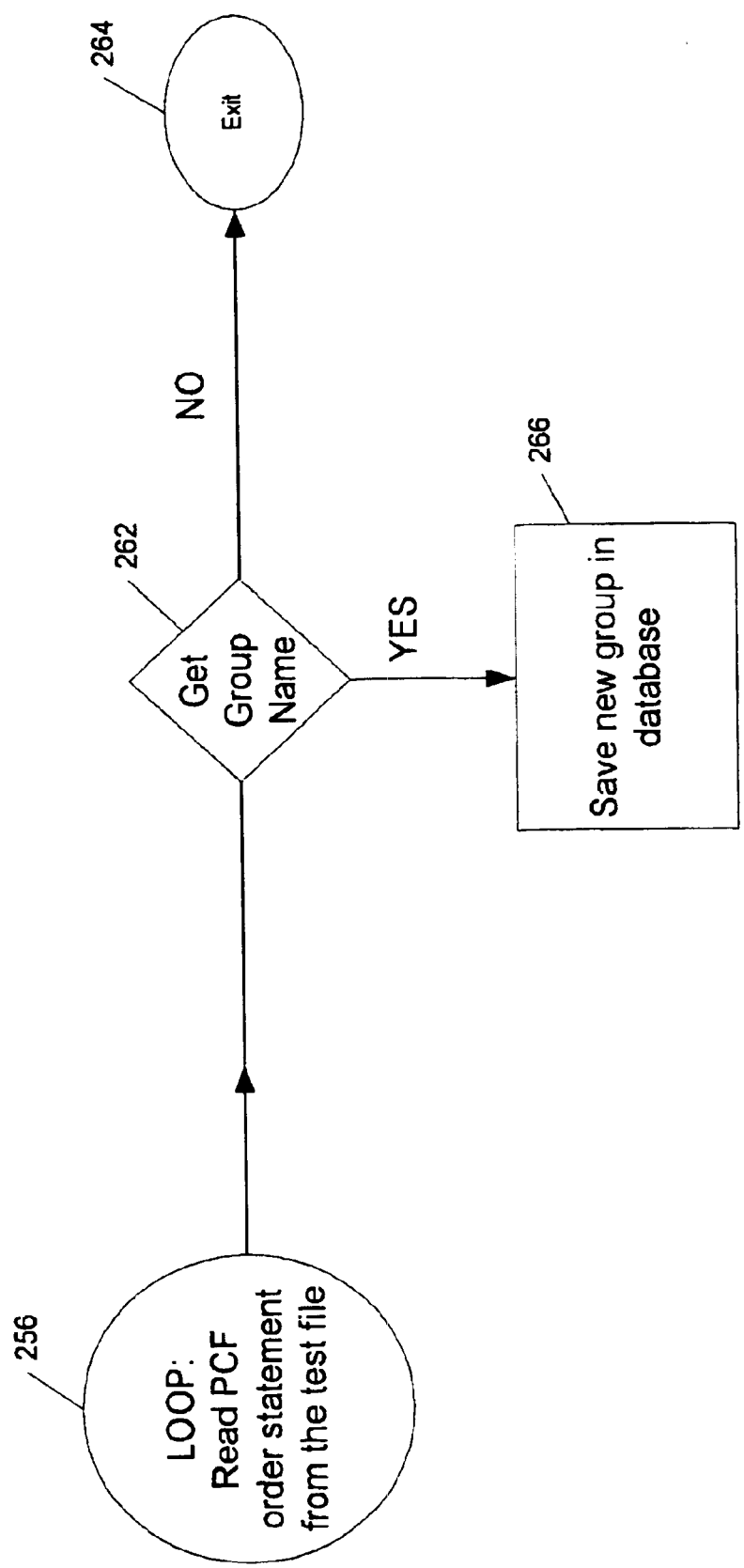
Figure 4H:
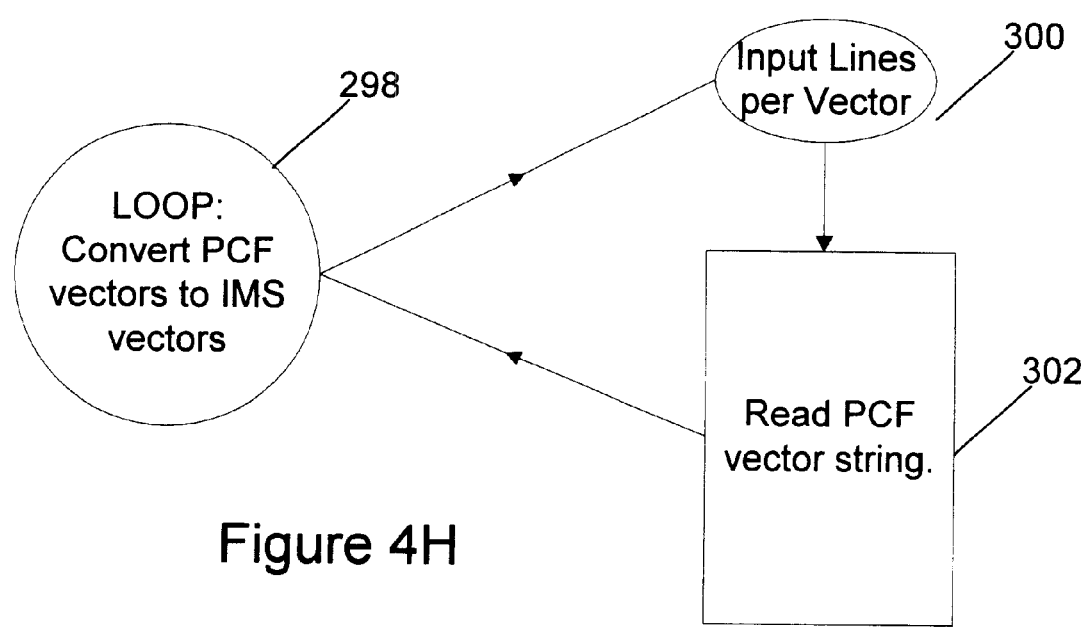
Figure 4I:
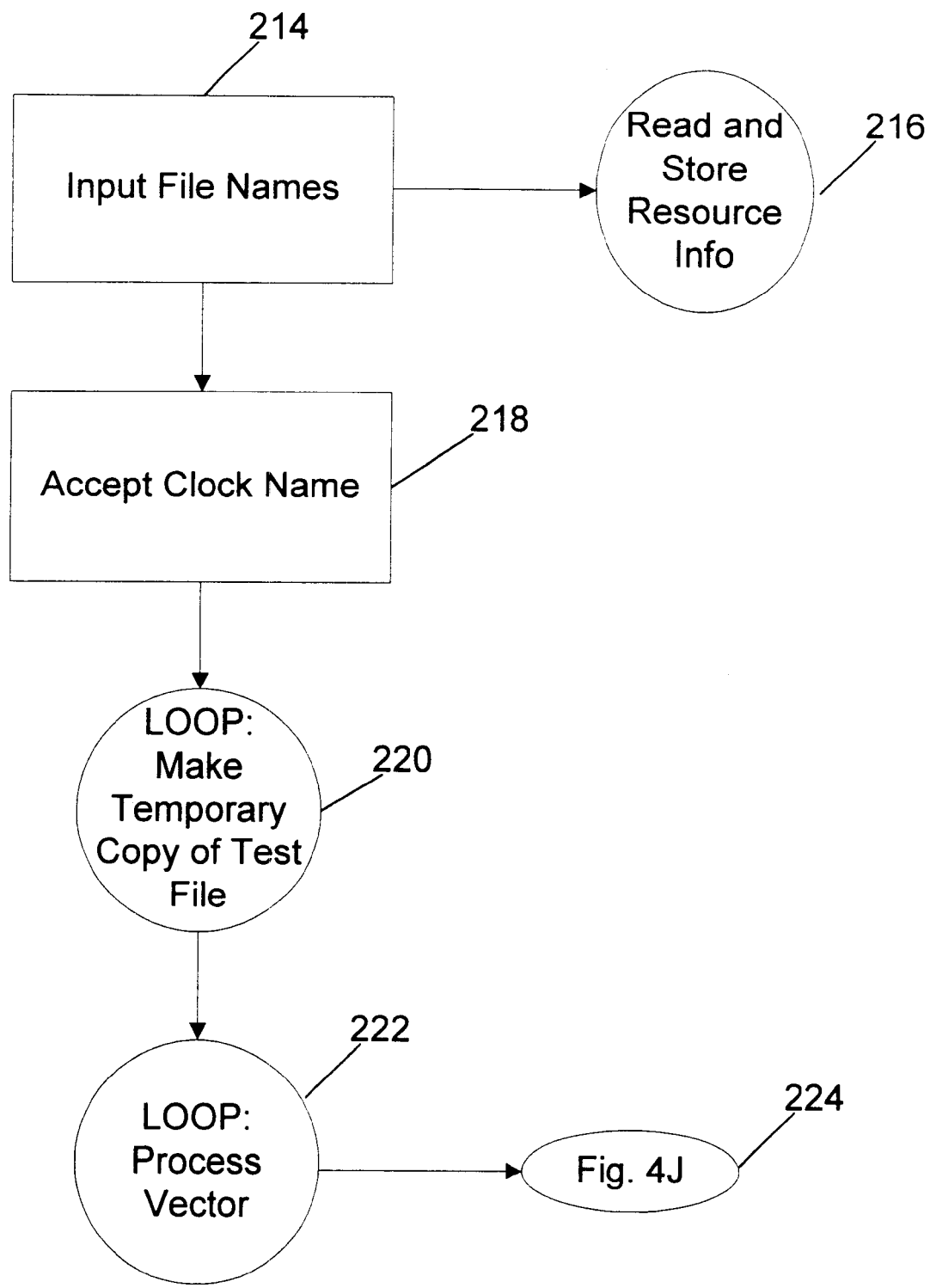
Figure 4J:
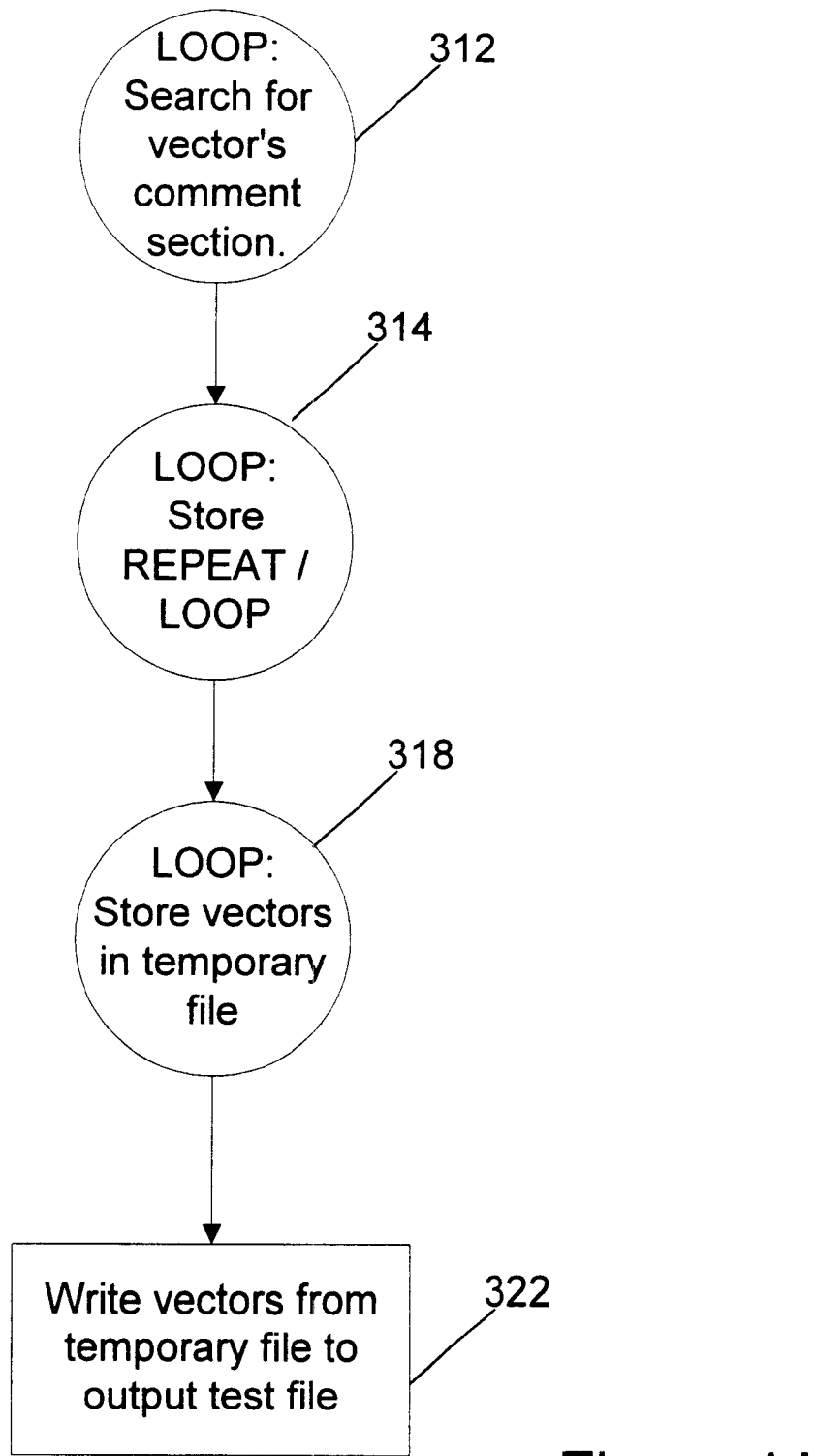

FIG. 4E provides a detailed flowchart for writing a PCF vector to a PCF file. For each IMS vector in the input IMS file, two PCF vectors are written to the output PCF file. The order in which the two vectors are written depends on the clock being used. A determination is made as to what type of clock is to be used at step 208. If the clock type is "R1," (return to 1) then, at step 210, the first of the two vectors is written with a "1" for clock data, while the second is written with a "0" for clock data. If the clock type is "RZ," then, at step 212, the first vector is written with a "0" for clock data, while the second is written with a "1" for clock data.

Once all of the vector data has been converted from IMS format into PCF, and written to the output PCF file, the program exits at step 160 as shown in FIG. 4C.

Translation of PCF Vectors to IMS

FIG. 4F provides a detailed flowchart of a method for converting PCF files to IMS format. An exemplary PCF input file is included as Appendix B hereof. At step 226, the program asks the user for the filename of the input PCF test file. The program also requests the filename of the file that includes the pin descriptions of the pins of the IC under test, and the number of lines in the input PCF file that represent a single PCF vector. At step 228, the input files are opened. If any of the required files is missing, or for any reason cannot be opened, the program exits at step 230. At step 234, a filename is created for the output IMS test file by changing the extension of the input PCF filename from "*.pcf" to "*.tst."

At step 236, internal data structures for the IMS vectors are created based on the PCF Order statement in the input PCF file. FIG. 4G provides the details of creating these data structures. First, the PCF order statement is read from the input test file at step 256. An array of data structures is created with an element for every IMS group. At step 262, the group name for the new group is determined, and resources for the new group are allocated. If, for some reason, step 262 goes awry, the program exits at step 264. Otherwise, the new group is saved, at step 266, in newly allocated space in a database.

Group assignments are made at step 238. First, a group assignment statement (i.e., "assign") is located in the PCF test file. Preferably, this statement assigns listed pins to a group name. After the group assignment statement is found, a check is made to determine if the group listed in the group assignment statement exists in the database. If the group exists, the program copies all pins to pin name variables in the appropriate structures in the database.

At step 240, a search is conducted for group type statements such as input, output, or bidirectional. If the group type is "input," then "input" is written into a "pin type" variable of the corresponding structure in the database. This procedure is repeated for every group found. Similarly, if the group type is "output," then "output" is written into the pin type variable of the corresponding structure in the database. Again, this procedure is repeated for every group found in the current line. Finally, if the group is "bidirectional," then the group is first set to "input" in the database. Then, a copy of the group is placed at the end of the resource array, with a modified name and pin type set to "output."

At step 242, pin information is read from the input parameter file. First, the line in the parameter file that includes the pin information is located. Preferably, the user inputs this information, or it is included in a separate file, such as the input PCF test file. Once it is read, the pin information is saved in an appropriate structure in the database.

Next, a pin mask is generated at step 244. First, the pin mask is initialized with pin order and pin type, and then it is initialized for bidirectional pins. Next, constraint data is read from the parameter file or the input PCF test file. Preferably, a constraint data section is added to the input PCF test file manually before the file is input to the translation program. A copy of the pin mask is generated, at step 246, and filled with the constraint data.

The groups are then checked, at step 248, to verify that each group has at least one pin defined, and that every pin has at least three names defined. If an error is found at this step, the program calls a general error handler. If no errors are found at step 248, then, at step 250, the pin information stored in the database is used to write IMS settings to the output IMS file.

The IMS data is written to the output IMS file at step 252. FIG. 4H provides a detailed flowchart for this function. At step 298, the program loops through the PCF vectors, converting each into a corresponding IMS vector. As discussed above, IMS can recognize whether one or two clocks per vector are required. However, it has been found during test debug that, sometimes, more than 2 clocks/vector is required. If this is the case, it is preferred that the user simply input the required number of clocks per vector. At step 300, this user input (i.e., number of lines per vector) is taken and valid lines are appended to the output file, thereby creating enough IMS vectors to satisfy the required number of clocks/vector. The PCF vector strings are read at step 302. Every character of the PCF vector string is read and, if the current character is valid, the program converts the character from PCF to IMS format using information stored in the pin mask.

Once all of the vector data has been converted from PCF into IMS format, and written to the output IMS file, the program exits at step 254 as shown in FIG. 4F.

Vector Clock Conversion

FIG. 4I provides a detailed flowchart of a method for converting test vectors from 1 clock/vector to 2 clocks/vector. At step 214, the program accepts the filename of the input IMS test file to be processed, as well as a filename for the new output test file to be generated. At step 216, resource information is read from the IMS file, and stored in an appropriate data structure. At step 218, the program prompts the user for the name of the clock to be used in the vector conversion. A temporary copy of the test file is made, at step 220, so that the temporary file can then be updated, without affecting the original input file. At step 222, the program loops through the IMS test file, reading each vector from the file and then processing it at step 224.

FIG. 4J provides a detailed flowchart of the processing performed for each vector. At step 312, the program loops through the vector to search for the vector's comment section. If a comment section is found, the program determines, at step 314, whether an instruction, such as a REPEAT or LOOP instruction, is found in the comment section. If so, the instruction is stored in an appropriate data structure. At step 318, all vectors that are part of the loop are written to the temporary file. First, the column in the data vector where the selected clock is defined is found for each vector. Then, the vectors are written to the temporary file with 2 vectors/clock instead of 1 vector/clock. After all of the vectors have been written to the temporary file, the vectors are written, at step 322, from the temporary file to the test file for the number of times defined in the loop statement.

Methods for Evaluating In-Circuit Tests Using Vector Translation

Throughout the process of in-circuit testing, it is often the case that an in-circuit test performed on a particular device under test (DUT) will fail. Frequently, the test operator will be unsure whether the test failed because the DUT is flawed or whether the board design is flawed. According to another aspect of the present invention, a test operator can use the vector translator described above to determine whether the DUT is flawed.

Figure 5:
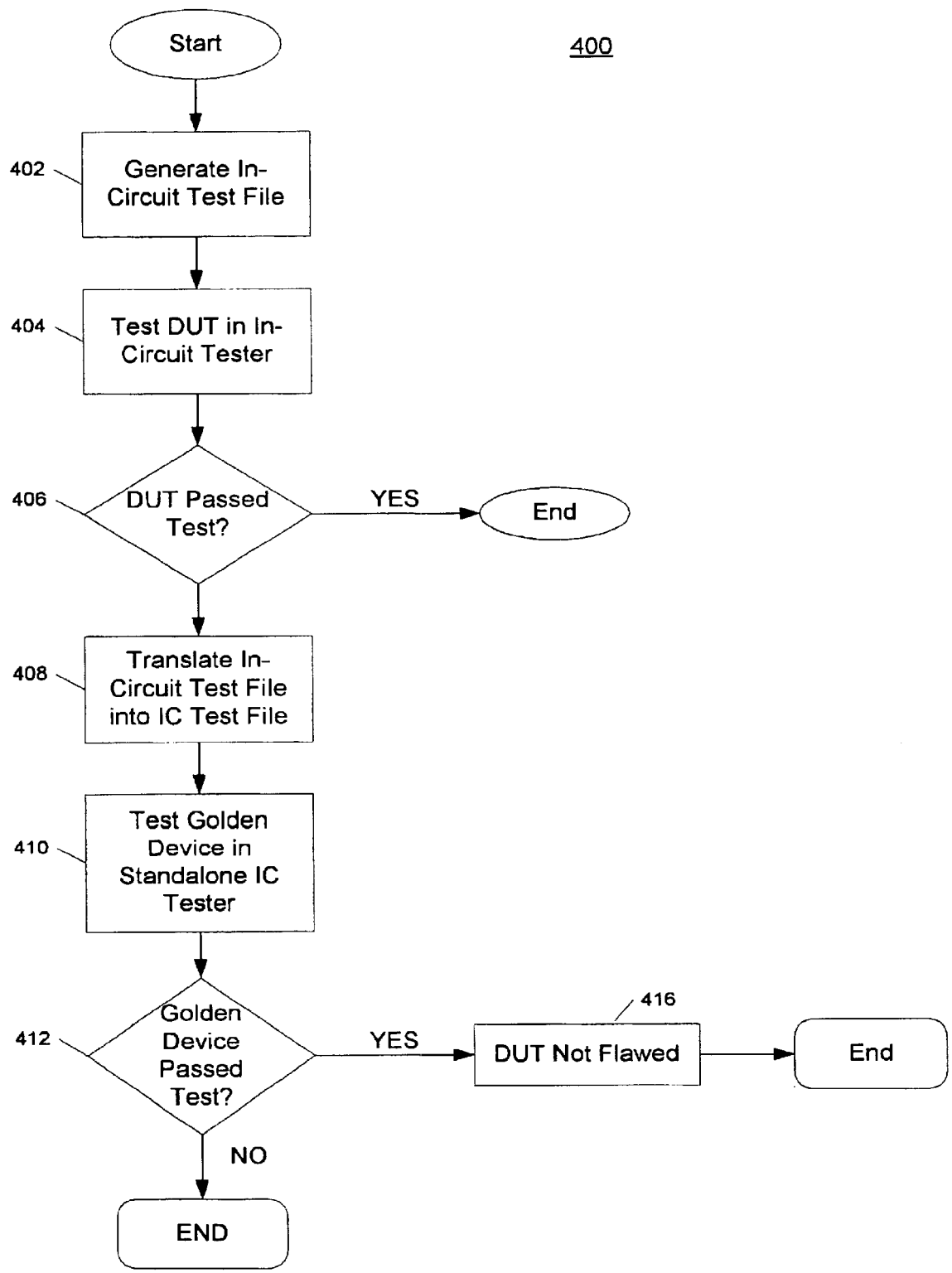
FIG. 5 provides a flowchart of a method for debugging an in-circuit test using a vector translator according to the present invention.

FIG. 5 provides a flowchart of a method for verifying an in-circuit test using a vector translator according to the present invention. At step 402 an in-circuit test file (such as described above) is generated in a format suitable for use with an in-circuit tester. At step 404, the in-circuit test file is used as input to the in-circuit tester to perform an in-circuit test on a device under test (DUT). The test operator then determines, at step 406, whether the in-circuit test is successful. If so, the test operator can reasonably conclude that neither the DUT nor the in-circuit test file is flawed.

If, on the other hand, the test operator determines at step 406 that the in-circuit test failed, the test operator cannot be sure whether it is the DUT, or some other aspect of the in-circuit test, that caused the failure. According to the present invention, however, the test operator can use a vector translator to verify that the DUT is not flawed.

To perform this analysis, the in-circuit test file is translated, at step 408, using the methods and apparatus described in detail above, into an IC test file in a format that is suitable for use with a standalone integrated circuit tester. The IC test file is then input into a standalone integrated circuit tester that has been set up to test a golden device, i.e., a device of the kind under test that has been proven to work properly. The operator can then determine, at step 412, whether the standalone IC test against the golden device is successful.

If the operator determines, at step 412, that the test against the golden device is successful, then the operator can reasonably conclude, at step 416, that the DUT works properly. Similarly, the operator can conclude that something else in the in-circuit test is flawed (e.g., the board design). If, however, the operator determines, at step 412, that the test against the golden device is not successful, further investigation is necessary to pinpoint whether it is the DUT, the in-circuit test file, the board design, or some other aspect of the in-circuit test that is flawed.

Thus there have been described apparatus and methods for translating test vectors between a format suitable for use with a standalone integrated circuit tester and a format suitable for use with an in-circuit tester. Those skilled in the art will appreciate that numerous changes and modifications may be made to the preferred embodiments of the invention and that such changes and modifications may be made without departing from the spirit of the invention. It is therefore intended that the appended claims cover all such equivalent variations as fall within the true spirit and scope of the invention.

USYS-0051                          18                                PATENT
                                                                    TN/142

APPENDIX A

```
    Rem ID Logic Master XL-60 V4.9a    Options: 1 Hard disk
    Rem [1] "I4CT scan test"
 5  Rem [2] ""
    Init
    SRQ 7
    Clk Internal,1.000us
    Event 0=User0,Off
10  Event 1=User1,Off
    Event 2=STM-2,Off
    Event 3=Error,On
    Socket "XL Open I/O-1020", "XL Open I/O-1020"
    Calibrate Fixture Offset 0ns
15  Config 0,"XL-60 Control","64K","Stimulation Control"
    Config 1,"XL-60 Split Data","64K","16 Force, 16 Compare Channels"
    Config 2,"XL-60 Split Data","64K","16 Force, 16 Compare Channels"
    Config 3,"XL-60 Split Data","64K","16 Force, 16 Compare Channels"
    Config 4,"XL-60 Split Data","64K","16 Force, 16 Compare Channels"
20  Config 5,"XL-60 Split Data","64K","16 Force, 16 Compare Channels"
    Config 6,"XL-60 Split Data","64K","16 Force, 16 Compare Channels"
    Config 7,"XL-60 Split Data","64K","16 Force, 16 Compare Channels"
    Config 8,"XL Timing","","System Timing, 1 Power Supply"
    Config 9,"XL-60 Split Data","64K","16 Force, 16 Compare Channels"
25  Config 10,"XL-60 Split Data","64K","16 Force, 16 Compare Channels"
    Config 11,"XL-60 Split Data","64K","16 Force, 16 Compare Channels"
    Config 12,"XL-60 Split Data","64K","16 Force, 16 Compare Channels"
    Config 13,"XL-60 Split Data","64K","16 Force, 16 Compare Channels"
    Config 14,"XL-60 Split Data","64K","16 Force, 16 Compare Channels"
30  Config 16,"Slave Control","64K","Stimulation Control"
    Config 24,"XL Timing","","System Timing, 1 Power Supply"
    Config 31,"XL PMU","","DC Parametric Measurement"

Testconditions #TXT
35    Start All
      Last Vector Maintain
      Branch Vector Maintain
    Testconditions End 40  Equation Recomputation Manual
    Equation End Resource CLOCKS=Force #TXT
      4B2, CLK, F03
45  Resource End
    Radix CLOCKS=Bin
    Polarity CLOCKS=Positive
    Lodrive CLOCKS=400mV
    Hidrive CLOCKS=3.00V
50
    Format CLOCKS=R1,200.0ns,400.0ns Resource CSN=Force #TXT
55    2B6, CSN, E02
    Resource End
    Radix CSN=Bin
    Polarity CSN=Positive
```

```
        Lodrive CSN=400mV
        Hidrive CSN=3.00V

Format CSN=NRZ
 5

Resource FSYNCI=Force #TXT
           10B5, FSNCI, C14
        Resource End
10      Radix FSYNCI=Bin
        Polarity FSYNCI=Positive
        Lodrive FSYNCI=400mV
        Hidrive FSYNCI=3.00V 15      Format FSYNCI=NRZ Resource JCMP__L=Force #TXT
           4B7, JCMPL, E03
20      Resource End
        Radix JCMP__L=Bin
        Polarity JCMP__L=Positive
        Lodrive JCMP__L=400mV
        Hidrive JCMP__L=3.00V
25
        Format JCMP__L=NRZ Resource MSGV=Force #TXT
30         6A4, MSGV, N10
        Resource End
        Radix MSGV=Bin
        Polarity MSGV=Positive
        Lodrive MSGV=400mV
35      Hidrive MSGV=3.00V Format MSGV=NRZ 40      Resource ONESEC=Force #TXT
           2B5, ONESC, E01
        Resource End
        Radix ONESEC=Bin
        Polarity ONESEC=Positive
45      Lodrive ONESEC=400mV
        Hidrive ONESEC=3.00V Format ONESEC=NRZ 50
        Resource PASRHT=Force #TXT
           1B5, PASRT, F04
        Resource End
        Radix PASRHT=Bin
55      Polarity PASRHT=Positive
        Lodrive PASRHT=400mV
        Hidrive PASRHT=3.00V Format PASRHT=NRZ
60
```

USYS-0051  20  PATENT
TN/142

```
        Resource RCV___L=Force #TXT
            5B1, RCV_L, C03
        Resource End
  5     Radix RCV___L=Bin
        Polarity RCV___L=Positive
        Lodrive RCV___L=400mV
        Hidrive RCV___L=3.00V 10     Format RCV___L=NRZ Resource R_SEL_L=Force #TXT
            1A0, RSELL, N05
 15     Resource End
        Radix R_SEL_L=Bin
        Polarity R_SEL_L=Positive
        Lodrive R_SEL_L=400mV
        Hidrive R_SEL_L=3.00V
 20
        Format R_SEL_L=NRZ Resource TACP__L=Force #TXT
 25         1A2, TACPL, N04
        Resource End
        Radix TACP__L=Bin
        Polarity TACP__L=Positive
        Lodrive TACP__L=400mV
 30     Hidrive TACP__L=3.00V Format TACP__L=NRZ 35     Resource T_SEL=Force #TXT
            1A4, T_SEL, M05
        Resource End
        Radix T_SEL=Bin
        Polarity T_SEL=Positive
 40     Lodrive T_SEL=400mV
        Hidrive T_SEL=3.00V Format T_SEL=NRZ 45
        Resource YCTRL00=Force #TXT
            2B3, YCL00, F02
        Resource End
        Radix YCTRL00=Bin
 50     Polarity YCTRL00=Positive
        Lodrive YCTRL00=400mV
        Hidrive YCTRL00=3.00V Format YCTRL00=NRZ
 55
        Resource YCTRL01=Force #TXT
            2B7, YCL01, D01
        Resource End
 60     Radix YCTRL01=Bin
```

USYS-0051

PATENT
TN/142

```
    Polarity YCTRL01=Positive
    Lodrive YCTRL01=400mV
    Hidrive YCTRL01=3.00V 5  Format YCTRL01=NRZ Resource YINPUT=Force #TXT
      2A5, YINPT, E05
10  Resource End
    Radix YINPUT=Bin
    Polarity YINPUT=Positive
    Lodrive YINPUT=400mV
    Hidrive YINPUT=3.00V
15
    Format YINPUT=NRZ Resource CLKTST=Force #TXT
20    1B3, CLKTS, G04
    Resource End
    Radix CLKTST=Bin
    Polarity CLKTST=Positive
    Lodrive CLKTST=400mV
25  Hidrive CLKTST=3.00V Format CLKTST=NRZ 30  Resource I_CSDAT_L=Force #TXT
      4A7, CSD00, R01
      6A0, CSD01, R06
      10A6, CSD02, R13
      12A7, CSD03, R16
35    9A7, CSD04, P10
      7A5, CSD05, P08
      4A6, CSD06, P02
      3A3, CSD07, N07
      11A7, CSD08, N12
40    13A3, CSD09, M16
      4A0, CSD10, M03
      2A1, CSD11, M01
      2A7, CSD12, K02
      14A6, CSD13, K15
45    14B7, CSD14, H15
      1B4, CSD15, H02
      2B0, CSD16, F01
      12B7, CSD17, E15
      7B2, CSD18, C08
50    4B0, CSD19, B02
      5B6, CSD20, B04
      9B1, CSD21, B11
      11B2, CSD22, B15
      11B6, CSD23, A16
55    10B4, CSD24, A14
      9B2, CSD25, A10
      6B7, CSD26, A06
      5B2, CSD27, A03
      4B6, CSD28, A01
60    3B7, CSD29, D02
```

USYS-0051 22 PATENT
TN/142

```
       10B3, CSD30, B13
       7B0, CSD31, B07
    Resource End
    Radix I_CSDAT_L=Bin
 5  Polarity I_CSDAT_L=Positive
    Lodrive I_CSDAT_L=400mV
    Hidrive I_CSDAT_L=3.00V Format I_CSDAT_L=NRZ
10

Resource I_CSDAT_U=Force #TXT
       10A0, CSD32, R14
       7A0, CSD33, R09
15     5A1, CSD34, R04
       6A6, CSD35, P05
       10A5, CSD36, P12
       3A4, CSD37, N01
       5A4, CSD38, N08
20     10A3, CSD39, N11
       11A3, CSD40, N13
       3A6, CSD41, N02
       12A6, CSD42, L14
       1A6, CSD43, L04
25     1A5, CSD44, M04
       4A5, CSD45, L03
       5B3, CSD46, B03
       1A7, CSD47, K04
       14A2, CSD48, J16
30     12A1, CSD49, J14
       3A5, CSD50, J03
       1A3, CSD51, J01
       1B6, CSD52, G01
       13B0, CSD53, F15
35     12B4, CSD54, D15
       4B5, CSD55, D03
       7B4, CSD56, C09
       12B2, CSD57, C16
       11B0, CSD58, A15
40     9B4, CSD59, A12
       7B7, CSD60, A09
       5B7, CSD61, A04
    Resource End
    Radix I_CSDAT_U=Bin
45  Polarity I_CSDAT_U=Positive
    Lodrive I_CSDAT_U=400mV
    Hidrive I_CSDAT_U=3.00V Format I_CSDAT_U=NRZ
50

Resource I_FRBUS=Force #TXT
       13B1, FRB00, F13
       13B3, FRB01, E13
55     11B5, FRB02, E14
       14B5, FRB03, E12
       13B4, FRB04, D13
       11B7, FRB05, D12
       14A1, FRB06, M12
60     11B3, FRB07, D11
```

USYS-0051                    23                   PATENT
                                                   TN/142

```
         6B0, FRB08, D09
         5B4, FRB09, D08
         5B0, FRB10, D07
         13A7, FRB11, M13
 5       13A0, FRB12, L13
         12A4, FRB13, K14
         14B0, FRB14, G13
         10B7, FRB15, D10
         3B0, FRB16, D06
10       2B4, FRB17, D05
    Resource End
    Radix I_FRBUS=Bin
    Polarity I_FRBUS=Positive
    Lodrive I_FRBUS=400mV
15  Hidrive I_FRBUS=3.00V Format I_FRBUS=NRZ 20  Resource I_IBDAT_L=Force #TXT
         5A7, IBD00, T02
         6A7, IBD01, T04
         7A4, IBD02, T07
         7A1, IBD03, T08
25       9A4, IBD04, T09
         9A2, IBD05, T11
         10A1, IBD06, T13
         9A0, IBD07, R11
         9A5, IBD08, R10
30       7A2, IBD09, R08
         7A6, IBD10, R07
         6A1, IBD11, P07
         7A3, IBD12, P09
         12A3, IBD13, P16
35       11A0, IBD14, T16
         2A3, IBD15, N06
         10A4, IBD16, T12
         11A5, IBD17, T14
         11A4, IBD18, R15
40       12A2, IBD19, N15
         11A2, IBD20, M14
         14A4, IBD21, L15
         14A0, IBD22, K16
         14A3, IBD23, J15
45       12B6, IBD24, H14
         14B4, IBD25, H16
         14B2, IBD26, G15
         14B3, IBD27, F16
         12B0, IBD28, C15
50       9B3, IBD29, B10
         7B6, IBD30, B09
         7B3, IBD31, B08
    Resource End
    Radix I_IBDAT_L=Bin
55  Polarity I_IBDAT_L=Positive
    Lodrive I_IBDAT_L=400mV
    Hidrive I_IBDAT_L=3.00V Format I_IBDAT_L=NRZ
60
```

```
Resource I_IBDAT_U=Force #TXT
    6A2, IBD32, T05
    5A3, IBD33, T03
    4A3, IBD34, T01
    4A1, IBD35, R02
    4A4, IBD36, P01
    4A2, IBD37, N03
    2A0, IBD38, M02
    2A4, IBD39, L01
    2A2, IBD40, L02
    2A6, IBD41, K01
    3A7, IBD42, K03
    1A1, IBD43, J02
    1B2, IBD44, H01
    3B6, IBD45, H03
    2B1, IBD46, G02
    3B5, IBD47, C01
    7B5, IBD48, A08
    6B5, IBD49, B06
    6B3, IBD50, B05
    1B0, IBD51, J04
    4B1, IBD52, B01
    4B3, IBD53, C02
Resource End
Radix I_IBDAT_U=Bin
Polarity I_IBDAT_U=Positive
Lodrive I_IBDAT_U=400mV
Hidrive I_IBDAT_U=3.00V Format I_IBDAT_U=NRZ Resource O_FRBUS=Compare #TXT
    13B1, FRB00, F13
    13B3, FRB01, E13
    11B5, FRB02, E14
    14B5, FRB03, E12
    13B4, FRB04, D13
    11B7, FRB05, D12
    14A1, FRB06, M12
    11B3, FRB07, D11
    6B0, FRB08, D09
    5B4, FRB09, D08
    5B0, FRB10, D07
    13A7, FRB11, M13
    13A0, FRB12, L13
    12A4, FRB13, K14
    14B0, FRB14, G13
    10B7, FRB15, D10
    3B0, FRB16, D06
    2B4, FRB17, D05
Resource End
Radix O_FRBUS=Bin
Polarity O_FRBUS=Positive
Threshold O_FRBUS=1.50V Sample O_FRBUS=900.0ns
```

USYS-0051     25     PATENT
TN/142

```
Resource CSADR=Compare #TXT
  7A7, CSA00, T06
  10A7, CSA01, P13
  9A1, CSA02, P11
  6A3, CSA03, P06
  5A2, CSA04, P04
  11A6, CSA05, N14
  12A0, CSA06, N16
  14A5, CSA07, L16
  11B1, CSA08, D14
  9B6, CSA09, C11
  10B1, CSA10, A13
  7B1, CSA11, A07
  6B2, CSA12, A05
  4B4, CSA13, A02
Resource End
Radix CSADR=Bin
Polarity CSADR=Positive
Threshold CSADR=1.50V Sample CSADR=900.0ns Resource O_IBADR=Compare #TXT
  9A6, IBA00, T10
  6A5, IBA01, R05
  9A3, IBA02, R12
  11A1, IBA03, T15
  12A5, IBA04, P15
  14B1, IBA05, G16
  13B2, IBA06, E16
  12B5, IBA07, D16
  11B4, IBA08, B16
  10B0, IBA09, C13
  10B6, IBA10, B14
  9B5, IBA11, B12
  6B4, IBA12, C06
  5B5, IBA13, C04
Resource End
Radix O_IBADR=Bin
Polarity O_IBADR=Positive
Threshold O_IBADR=1.50V Sample O_IBADR=900.0ns Resource Gen_Contr=Compare #TXT
  10A2, FSNC0, P14
  2B2, RCVDL, D04
  5A0, W_REQ, N09
  5A6, R_REQ, P03
  9B0, RSTCL, C10
  1B1, MAINT, H04
  6B6, INTFN, C07
  12B3, PLM_L, G14
  14B6, BRTML, H13
  13A2, SEND, K13
Resource End
Radix Gen_Contr=Bin
Polarity Gen_Contr=Positive
```

```
       Threshold Gen_Contr=1.50V

Sample Gen_Contr=900.0ns

Resource LM_WRRD=Compare #TXT
          5A5, LMOEL, R03
          13A1, LMWEL, M15
       Resource End
       Radix LM_WRRD=Bin
       Polarity LM_WRRD=Positive
       Threshold LM_WRRD=1.50V Sample LM_WRRD=900.0ns Resource CS_WRRD=Compare #TXT
          9B7, CSOE, A11
          12B1, CSWE, F14
       Resource End
       Radix CS_WRRD=Bin
       Polarity CS_WRRD=Positive
       Threshold CS_WRRD=1.50V Sample CS_WRRD=900.0ns Resource SLBUS=Compare #TXT
          3B4, SLB00, G03
          6B1, SLB01, C05
          10B2, SLB02, C12
          14A7, SLB03, J13
          1B7, SLB04, E04
       Resource End
       Radix SLBUS=Bin
       Polarity SLBUS=Positive
       Threshold SLBUS=1.50V Sample SLBUS=900.0ns Resource O_CSDAT_L=Compare #TXT
          4A7, CSD00, R01
          6A0, CSD01, R06
          10A6, CSD02, R13
          12A7, CSD03, R16
          9A7, CSD04, P10
          7A5, CSD05, P08
          4A6, CSD06, P02
          3A3, CSD07, N07
          11A7, CSD08, N12
          13A3, CSD09, M16
          4A0, CSD10, M03
          2A1, CSD11, M01
          2A7, CSD12, K02
          14A6, CSD13, K15
          14B7, CSD14, H15
          1B4, CSD15, H02
          2B0, CSD16, F01
          12B7, CSD17, E15
```

```
        7B2, CSD18, C08
        4B0, CSD19, B02
        5B6, CSD20, B04
        9B1, CSD21, B11
        11B2, CSD22, B15
        11B6, CSD23, A16
        10B4, CSD24, A14
        9B2, CSD25, A10
        6B7, CSD26, A06
        5B2, CSD27, A03
        4B6, CSD28, A01
        3B7, CSD29, D02
        10B3, CSD30, B13
        7B0, CSD31, B07
Resource End
Radix O_CSDAT_L=Bin
Polarity O_CSDAT_L=Positive
Threshold O_CSDAT_L=1.50V Sample O_CSDAT_L=900.0ns Resource O_CSDAT_U=Compare #TXT
        10A0, CSD32, R14
        7A0, CSD33, R09
        5A1, CSD34, R04
        6A6, CSD35, P05
        10A5, CSD36, P12
        3A4, CSD37, N01
        5A4, CSD38, N08
        10A3, CSD39, N11
        11A3, CSD40, N13
        3A6, CSD41, N02
        12A6, CSD42, L14
        1A6, CSD43, L04
        1A5, CSD44, M04
        4A5, CSD45, L03
        5B3, CSD46, B03
        1A7, CSD47, K04
        14A2, CSD48, J16
        12A1, CSD49, J14
        3A5, CSD50, J03
        1A3, CSD51, J01
        1B6, CSD52, G01
        13B0, CSD53, F15
        12B4, CSD54, D15
        4B5, CSD55, D03
        7B4, CSD56, C09
        12B2, CSD57, C16
        11B0, CSD58, A15
        9B4, CSD59, A12
        7B7, CSD60, A09
        5B7, CSD61, A04
Resource End
Radix O_CSDAT_U=Bin
Polarity O_CSDAT_U=Positive
Threshold O_CSDAT_U=1.50V Sample O_CSDAT_U=900.0ns
```

USYS-0051                          28                          PATENT
                                                                TN/142

```
        Resource O_IBDAT_L=Compare #TXT
          5A7, IBD00, T02
          6A7, IBD01, T04
 5        7A4, IBD02, T07
          7A1, IBD03, T08
          9A4, IBD04, T09
          9A2, IBD05, T11
          10A1, IBD06, T13
10        9A0, IBD07, R11
          9A5, IBD08, R10
          7A2, IBD09, R08
          7A6, IBD10, R07
          6A1, IBD11, P07
15        7A3, IBD12, P09
          12A3, IBD13, P16
          11A0, IBD14, T16
          2A3, IBD15, N06
          10A4, IBD16, T12
20        11A5, IBD17, T14
          11A4, IBD18, R15
          12A2, IBD19, N15
          11A2, IBD20, M14
          14A4, IBD21, L15
25        14A0, IBD22, K16
          14A3, IBD23, J15
          12B6, IBD24, H14
          14B4, IBD25, H16
          14B2, IBD26, G15
30        14B3, IBD27, F16
          12B0, IBD28, C15
          9B3, IBD29, B10
          7B6, IBD30, B09
          7B3, IBD31, B08
35      Resource End
        Radix O_IBDAT_L=Bin
        Polarity O_IBDAT_L=Positive
        Threshold O_IBDAT_L=1.50V 40      Sample O_IBDAT_L=900.0ns Resource O_IBDAT_U=Compare #TXT
          6A2, IBD32, T05
45        5A3, IBD33, T03
          4A3, IBD34, T01
          4A1, IBD35, R02
          4A4, IBD36, P01
          4A2, IBD37, N03
50        2A0, IBD38, M02
          2A4, IBD39, L01
          2A2, IBD40, L02
          2A6, IBD41, K01
          3A7, IBD42, K03
55        1A1, IBD43, J02
          1B2, IBD44, H01
          3B6, IBD45, H03
          2B1, IBD46, G02
          3B5, IBD47, C01
60        7B5, IBD48, A08
```

USYS-0051                                29                             PATENT
                                                                         TN/142

```
         6B5, IBD49, B06
         6B3, IBD50, B05
         1B0, IBD51, J04
         4B1, IBD52, B01
 5       4B3, IBD53, C02
      Resource End
      Radix O_IBDAT_U=Bin
      Polarity O_IBDAT_U=Positive
      Threshold O_IBDAT_U=1.50V
10
      Sample O_IBDAT_U=900.0ns Resource POWER=Power,HP1 #TXT
15       HP1, HP3, VCC
      Resource End
      Power POWER=4.982V,1.007A,0ms,LOZ 20    Equation End
      Equation Recomputation Auto Waveform Display #TXT
      Waveform End
25    Waveform Magnify=20
      Waveform Markers Sequence="Off","Off"

Display Compare="Expect and Acquire"
      Fail 0
30    Mask "1111111111111111 1111111111111 111111111111111 1111111111 11 11
      11111 111111111111111111111111111111 11111111111111111111111111111111
      11111111111111111111111111111111 11111111111111111111111"
      Acp Setup_Hold Binary #TXT
      Acp Prop_Delay Binary #TXT
35    Acp End
      Fail Acp Setup = 0, Hold = 0, Prop = 0, Analysis = 0
      Mem 0 #TXT
      0 1 0 0 0 0 0 0 0 0 1 1 1 0 zzzzzzzzzzzzzzzzzzzzzzzzzzzzzz
      zzzzzzzzzzzzzzzzzzzzzzzzzzzzz zzzzzzzzzzzzzzzzzzz
40    zzzzzzzzzzzzzzzzzzzzzzzzzzzzzzzz zzzzzzzzzzzzzzzzzzzzzzzzz   xxxxxxxxxxxxxxxxx
      xxxxxxxxxxxxxx xxxxxxxxxxxxxx xxxxxxxxx xx xx xxxxx
      xxxxxxxxxxxxxxxxxxxxxxxxxxxxxxxx xxxxxxxxxxxxxxxxxxxxxxxxxxxxxxxx
      xxxxxxxxxxxxxxxxxxxxxxxxxxxxxxxxxxxx xxxxxxxxxxxxxxxxxxxxxxxxxxxx
      0 1 0 0 0 0 0 0 0 0 1 1 1 0 zzzzzzzzzzzzzzzzzzzzzzzzzzzzzz
45    zzzzzzzzzzzzzzzzzzzzzzzzzzzzz zzzzzzzzzzzzzzzzzzz
      zzzzzzzzzzzzzzzzzzzzzzzzzzzzzzzz zzzzzzzzzzzzzzzzzzzzzzzzzzzzz   xxxxxxxxxxxxxxxxx
      xxxxxxxxxxxxxx xxxxxxxxxxxxxx xxxxxxxxx xx xx xxxxx
      xxxxxxxxxxxxxxxxxxxxxxxxxxxxxxxx xxxxxxxxxxxxxxxxxxxxxxxxxxxxxxxx
      xxxxxxxxxxxxxxxxxxxxxxxxxxxxxxxxxxxx xxxxxxxxxxxxxxxxxxxxxxxxxxxx
50    0 1 0 0 0 0 0 0 0 0 1 1 0 0 zzzzzzzzzzzzzzzzzzzzzzzzzzzzzz
      zzzzzzzzzzzzzzzzzzzzzzzzzzzzz zzzzzzzzzzzzzzzzzzz
      zzzzzzzzzzzzzzzzzzzzzzzzzzzzzzzz zzzzzzzzzzzzzzzzzzzzzzzzzzzzz   xxxxxxxxxxxxxxxxx
      xxxxxxxxxxxxxx xxxxxxxxxxxxxx xxxxxxxxx xx xx xxxxx
      xxxxxxxxxxxxxxxxxxxxxxxxxxxxxxxx xxxxxxxxxxxxxxxxxxxxxxxxxxxxxxxx
55    xxxxxxxxxxxxxxxxxxxxxxxxxxxxxxxxxxxx xxxxxxxxxxxxxxxxxxxxxxxxxxxx
      0 1 0 0 0 0 0 0 0 0 1 1 1 0 zzzzzzzzzzzzzzzzzzzzzzzzzzzzzz
      zzzzzzzzzzzzzzzzzzzzzzzzzzzzz zzzzzzzzzzzzzzzzzzz
      zzzzzzzzzzzzzzzzzzzzzzzzzzzzzzzz zzzzzzzzzzzzzzzzzzzzzzzzzzzzz   xxxxxxxxxxxxxxxxx
      xxxxxxxxxxxxxx xxxxxxxxxxxxxx xxxxxxxxx xx xx xxxxx
```

USYS-0051                                    30                              PATENT
                                                                             TN/142

```
    xxxxxxxxxxxxxxxxxxxxxxxxxxxxx xxxxxxxxxxxxxxxxxxxxxxxxxxxxx
    xxxxxxxxxxxxxxxxxxxxxxxxxxxxx xxxxxxxxxxxxxxxxxxxx
    0 1 0 0 0 0 0 0 0 0 0 1 1 1 0 zzzzzzzzzzzzzzzzzzzzzzzzzzzzzzzz
    zzzzzzzzzzzzzzzzzzzzzzzzzzzzzz zzzzzzzzzzzzzzzzzzz
 5  zzzzzzzzzzzzzzzzzzzzzzzzzzzzzz zzzzzzzzzzzzzzzzzzzzzzzzzzz  xxxxxxxxxxxxxxxxxx
    xxxxxxxxxxxxxx xxxxxxxxxxxxxx xxxxxxxxx xx xx xxxxx
    xxxxxxxxxxxxxxxxxxxxxxxxxxxxx xxxxxxxxxxxxxxxxxxxxxxxxxxxxx
    xxxxxxxxxxxxxxxxxxxxxxxxxxxxx xxxxxxxxxxxxxxxxxxxx
    0 1 0 0 0 0 0 0 0 0 0 1 1 1 0 zzzzzzzzzzzzzzzzzzzzzzzzzzzzzzzz
10  zzzzzzzzzzzzzzzzzzzzzzzzzzzzzz zzzzzzzzzzzzzzzzzzz
    zzzzzzzzzzzzzzzzzzzzzzzzzzzzzz zzzzzzzzzzzzzzzzzzzzzzzzzzz  xxxxxxxxxxxxxxxxxx
    xxxxxxxxxxxxxx xxxxxxxxxxxxxx xxxxxxxxx xx xx xxxxx
    xxxxxxxxxxxxxxxxxxxxxxxxxxxxx xxxxxxxxxxxxxxxxxxxxxxxxxxxxx
    xxxxxxxxxxxxxxxxxxxxxxxxxxxxx xxxxxxxxxxxxxxxxxxxx             :  Loop 7 Times
15  0 1 0 0 0 0 0 0 0 0 0 1 1 0 0 zzzzzzzzzzzzzzzzzzzzzzzzzzzzzzzz
    zzzzzzzzzzzzzzzzzzzzzzzzzzzzzz zzzzzzzzzzzzzzzzzzz
    zzzzzzzzzzzzzzzzzzzzzzzzzzzzzz zzzzzzzzzzzzzzzzzzzzzzzzzzz  xxxxxxxxxxxxxxxxxx
    xxxxxxxxxxxxxx xxxxxxxxxxxxxx xxxxxxxxx xx xx xxxxx
    xxxxxxxxxxxxxxxxxxxxxxxxxxxxx xxxxxxxxxxxxxxxxxxxxxxxxxxxxx
20  xxxxxxxxxxxxxxxxxxxxxxxxxxxxx xxxxxxxxxxxxxxxxxxxx             :  End Loop
    1 1 0 0 0 0 0 0 0 0 0 1 1 0 0 zzzzzzzzzzzzzzzzzzzzzzzzzzzzzzzz
    zzzzzzzzzzzzzzzzzzzzzzzzzzzzzz zzzzzzzzzzzzzzzzzzz
    zzzzzzzzzzzzzzzzzzzzzzzzzzzzzz zzzzzzzzzzzzzzzzzzzzzzzzzzz  xxxxxxxxxxxxxxxxxx
    xxxxxxxxxxxxxx xxxxxxxxxxxxxx xx1xxxxxxx xx xx xxxxx
25  xxxxxxxxxxxxxxxxxxxxxxxxxxxxx xxxxxxxxxxxxxxxxxxxxxxxxxxxxx
    xxxxxxxxxxxxxxxxxxxxxxxxxxxxx xxxxxxxxxxxxxxxxxxxx
    0 1 0 0 0 0 0 0 0 0 0 1 1 0 0 zzzzzzzzzzzzzzzzzzzzzzzzzzzzzzzz
    zzzzzzzzzzzzzzzzzzzzzzzzzzzzzz zzzzzzzzzzzzzzzzzzz
    zzzzzzzzzzzzzzzzzzzzzzzzzzzzzz zzzzzzzzzzzzzzzzzzzzzzzzzzz  xxxxxxxxxxxxxxxxxx
30  xxxxxxxxxxxxxx xxxxxxxxxxxxxx xx1xxxxxxx xx xx xxxxx
    xxxxxxxxxxxxxxxxxxxxxxxxxxxxx xxxxxxxxxxxxxxxxxxxxxxxxxxxxx
    xxxxxxxxxxxxxxxxxxxxxxxxxxxxx xxxxxxxxxxxxxxxxxxxx
    0 1 0 0 0 0 0 0 0 0 0 1 1 0 0 zzzzzzzzzzzzzzzzzzzzzzzzzzzzzzzz
    zzzzzzzzzzzzzzzzzzzzzzzzzzzzzz zzzzzzzzzzzzzzzzzzz
35  zzzzzzzzzzzzzzzzzzzzzzzzzzzzzz zzzzzzzzzzzzzzzzzzzzzzzzzzz  xxxxxxxxxxxxxxxxxx
    xxxxxxxxxxxxxx xxxxxxxxxxxxxx xx0xxxxxxx xx xx xxxxx
    xxxxxxxxxxxxxxxxxxxxxxxxxxxxx xxxxxxxxxxxxxxxxxxxxxxxxxxxxx
    xxxxxxxxxxxxxxxxxxxxxxxxxxxxx xxxxxxxxxxxxxxxxxxxx
    0 1 0 0 0 0 0 0 0 0 0 1 1 0 0 zzzzzzzzzzzzzzzzzzzzzzzzzzzzzzzz
40  zzzzzzzzzzzzzzzzzzzzzzzzzzzzzz zzzzzzzzzzzzzzzzzzz
    zzzzzzzzzzzzzzzzzzzzzzzzzzzzzz zzzzzzzzzzzzzzzzzzzzzzzzzzz  xxxxxxxxxxxxxxxxxx
    xxxxxxxxxxxxxx xxxxxxxxxxxxxx xx1xxxxxxx xx xx xxxxx
    xxxxxxxxxxxxxxxxxxxxxxxxxxxxx xxxxxxxxxxxxxxxxxxxxxxxxxxxxx
    xxxxxxxxxxxxxxxxxxxxxxxxxxxxx xxxxxxxxxxxxxxxxxxxx
45  0 1 0 0 0 0 0 0 0 0 0 1 1 0 0 zzzzzzzzzzzzzzzzzzzzzzzzzzzzzzzz
    zzzzzzzzzzzzzzzzzzzzzzzzzzzzzz zzzzzzzzzzzzzzzzzzz
    zzzzzzzzzzzzzzzzzzzzzzzzzzzzzz zzzzzzzzzzzzzzzzzzzzzzzzzzz  xxxxxxxxxxxxxxxxxx
    xxxxxxxxxxxxxx xxxxxxxxxxxxxx xx1xxxxxxx xx xx xxxxx
    xxxxxxxxxxxxxxxxxxxxxxxxxxxxx xxxxxxxxxxxxxxxxxxxxxxxxxxxxx
50  xxxxxxxxxxxxxxxxxxxxxxxxxxxxx xxxxxxxxxxxxxxxxxxxx
    0 1 0 0 0 0 0 0 0 0 0 1 1 0 0 zzzzzzzzzzzzzzzzzzzzzzzzzzzzzzzz
    zzzzzzzzzzzzzzzzzzzzzzzzzzzzzz zzzzzzzzzzzzzzzzzzz
    zzzzzzzzzzzzzzzzzzzzzzzzzzzzzz zzzzzzzzzzzzzzzzzzzzzzzzzzz  xxxxxxxxxxxxxxxxxx
    xxxxxxxxxxxxxx xxxxxxxxxxxxxx xx1xxxxxxx xx xx xxxxx
55  xxxxxxxxxxxxxxxxxxxxxxxxxxxxx xxxxxxxxxxxxxxxxxxxxxxxxxxxxx
    xxxxxxxxxxxxxxxxxxxxxxxxxxxxx xxxxxxxxxxxxxxxxxxxx             :  Loop 7 Times
    0 1 0 0 0 0 0 0 0 0 1 1 0 0 zzzzzzzzzzzzzzzzzzzzzzzzzzzzzzzz
    zzzzzzzzzzzzzzzzzzzzzzzzzzzzzz zzzzzzzzzzzzzzzzzzz
    zzzzzzzzzzzzzzzzzzzzzzzzzzzzzz zzzzzzzzzzzzzzzzzzzzzzzzzzz  xxxxxxxxxxxxxxxxxx
60  xxxxxxxxxxxxxx xxxxxxxxxxxxxx xx0xxxxxxx xx xx xxxxx
```

USYS-0051  31  PATENT
TN/142

```
     xxxxxxxxxxxxxxxxxxxxxxxxxxxxxxx xxxxxxxxxxxxxxxxxxxxxxxxxxxxxx
     xxxxxxxxxxxxxxxxxxxxxxxxxxxxxxx xxxxxxxxxxxxxxxxxxxxx :   End Loop
     0 0 0 0 0 0 0 0 0 0 0 0 0 0 z zzzzzzzzzzzzzzzzzzzzzzzzzzzzzz
     zzzzzzzzzzzzzzzzzzzzzzzzzzzzzz zzzzzzzzzzzzzzzzzz
  5  zzzzzzzzzzzzzzzzzzzzzzzzzzzzzz zzzzzzzzzzzzzzzzzzzzz  xxxxxxxxxxxxxxxxxx
     xxxxxxxxxxxxx xxxxxxxxxxxxxx xxxxxxxxx xx xx xxxxx
     xxxxxxxxxxxxxxxxxxxxxxxxxxxxxx xxxxxxxxxxxxxxxxxxxxxxxxxxxxxx
     xxxxxxxxxxxxxxxxxxxxxxxxxxxxxx xxxxxxxxxxxxxxxxxxxxx :   Halt
     Mem End
 10  End
```

USYS-0051        32        PATENT
                            TN/142

APPENDIX B

```
        assign CLOCKS to pins "F03"
 5      assign CSN to pins "E02"
        assign FSYNCI to pins "C14"
        assign JCMP__L to pins "E03"
        assign MSGV to pins "N10"
        assign ONESEC to pins "E01"
10      assign PASRHT to pins "F04"
        assign RCV___L to pins "C03"
        assign R_SEL_L to pins "N05"
        assign TACP__L to pins "N04"
        assign T_SEL to pins "M05"
15      assign YCTRL00 to pins "F02"
        assign YCTRL01 to pins "D01"
        assign YINPUT to pins "E05"
        assign CLKTST to pins "G04"
        assign I_CSDAT_L to pins
20      "R01","R06","R13","R16","P10","P08","P02","N07","N12","M16","M03","M01","K0
        2","K15","H15","H02","F01","E15","C08","B02","B04","B11","B15","A16","A14",
        "A10","A06","A03","A01","D02","B13","B07"
        assign I_CSDAT_U to pins
        "R14","R09","R04","P05","P12","N01","N08","N11","N13","N02","L14","L04","M0
25      4","L03","B03","K04","J16","J14","J03","J01","G01","F15","D15","D03","C09",
        "C16","A15","A12","A09","A04"
        assign I_FRBUS to pins
        "F13","E13","E14","E12","D13","D12","M12","D11","D09","D08","D07","M13","L1
        3","K14","G13","D10","D06","D05"
30      assign I_IBDAT_L to pins
        "T02","T04","T07","T08","T09","T11","T13","R11","R10","R08","R07","P07","P0
        9","P16","T16","N06","T12","T14","R15","N15","M14","L15","K16","J15","H14",
        "H16","G15","F16","C15","B10","B09","B08"
        assign I_IBDAT_U to pins
35      "T05","T03","T01","R02","P01","N03","M02","L01","L02","K01","K03","J02","H0
        1","H03","G02","C01","A08","B06","B05","J04","B01","C02"
        assign CSADR to pins
        "T06","P13","P11","P06","P04","N14","N16","L16","D14","C11","A13","A07","A0
        5","A02"
40      assign O_IBADR to pins
        "T10","R05","R12","T15","P15","G16","E16","D16","B16","C13","B14","B12","C0
        6","C04"
        assign Gen_Contr to pins
        "P14","D04","N09","P03","C10","H04","C07","G14","H13","K13"
45      assign LM_WRRD to pins "R03","M15"
        assign CS_WRRD to pins "A11","F14"
        assign SLBUS to pins "G03","C05","C12","J13","E04"
        assign VCC to pins
        "F10","F09","F08","F07","G11","G10","G07","G06","H11","H06","J11","J06","K1
50      1","K07","K10","K06","L10","L09","L08","L07"
        assign GND to pins
        "E11","E10","E09","E08","E07","E06","F12","F11","F06","F05","G12","G09","G0
        8","G05","H12","H10","H09","H08","H05","J12","J10","J09","J08","J07","J05",
        "K12","K09","K08","K05","L12","L11","L06","L05","M11","M10","M09","M08","M0
55      7","M06"

power VCC,GND
        inputs
        CLOCKS,CSN,FSYNCI,JCMP__L,MSGV,ONESEC,PASRHT,RCV___L,R_SEL_L,TACP__L,T_SEL,
60      YCTRL00,YCTRL01,YINPUT,CLKTST
```

```
outputs   CSADR,O_IBADR,Gen_Contr,LM_WRRD,CS_WRRD,SLBUS bidirectional   I_CSDAT_L,I_CSDAT_U,I_FRBUS,I_IBDAT_L,I_IBDAT_U !    Drive High    3.0
!    Drive Low     0.2
!    Receive Low   0.8
!    Edge Speed    50
!    Open Input Default    X
! Load
family Cmos 5 pcf order All is CLOCKS, CSN, FSYNCI, JCMP__L, MSGV, ONESEC, PASRHT,
RCV___L, R_SEL_L, TACP__L, T_SEL, YCTRL00, YCTRL01, YINPUT, CLKTST,
I_CSDAT_L, I_CSDAT_U, I_FRBUS, I_IBDAT_L, I_IBDAT_U, CSADR, O_IBADR,
Gen_Contr, LM_WRRD, CS_WRRD, SLBUS unit "PCF blocks"
pcf
use pcf order All
"0 1 0 0 0 0 0 0 0 0 1 1 1 0 ZZZZZZZZZZZZZZZZZZZZZZZZZZZZZZZ
ZZZZZZZZZZZZZZZZZZZZZZZZZZZZZZZ ZZZZZZZZZZZZZZZZZZZ
ZZZZZZZZZZZZZZZZZZZZZZZZZZZZZZZ ZZZZZZZZZZZZZZZZZZZZZZZZZZZ    XXXXXXXXXXXXX
XXXXXXXXXXXXXX XXXXXXXXX XX XX XXXXX      " ! --1 -- 1
"1 1 0 0 0 0 0 0 0 0 1 1 1 0 ZZZZZZZZZZZZZZZZZZZZZZZZZZZZZZZ
ZZZZZZZZZZZZZZZZZZZZZZZZZZZZZZZ ZZZZZZZZZZZZZZZZZZZ
ZZZZZZZZZZZZZZZZZZZZZZZZZZZZZZZ ZZZZZZZZZZZZZZZZZZZZZZZZZZZ    XXXXXXXXXXXXX
XXXXXXXXXXXXXX XXXXXXXXX XX XX XXXXX      " ! --1 -- 1
"0 1 0 0 0 0 0 0 0 0 1 1 1 0 ZZZZZZZZZZZZZZZZZZZZZZZZZZZZZZZ
ZZZZZZZZZZZZZZZZZZZZZZZZZZZZZZZ ZZZZZZZZZZZZZZZZZZZ
ZZZZZZZZZZZZZZZZZZZZZZZZZZZZZZZ ZZZZZZZZZZZZZZZZZZZZZZZZZZZ    XXXXXXXXXXXXX
XXXXXXXXXXXXXX XXXXXXXXX XX XX XXXXX      " ! --2 -- 2
"1 1 0 0 0 0 0 0 0 0 1 1 1 0 ZZZZZZZZZZZZZZZZZZZZZZZZZZZZZZZ
ZZZZZZZZZZZZZZZZZZZZZZZZZZZZZZZ ZZZZZZZZZZZZZZZZZZZ
ZZZZZZZZZZZZZZZZZZZZZZZZZZZZZZZ ZZZZZZZZZZZZZZZZZZZZZZZZZZZ    XXXXXXXXXXXXX
XXXXXXXXXXXXXX XXXXXXXXX XX XX XXXXX      " ! --2 -- 2
"0 1 0 0 0 0 0 0 0 0 1 1 0 0 ZZZZZZZZZZZZZZZZZZZZZZZZZZZZZZZ
ZZZZZZZZZZZZZZZZZZZZZZZZZZZZZZZ ZZZZZZZZZZZZZZZZZZZ
ZZZZZZZZZZZZZZZZZZZZZZZZZZZZZZZ ZZZZZZZZZZZZZZZZZZZZZZZZZZZ    XXXXXXXXXXXXX
XXXXXXXXXXXXXX XXXXXXXXX XX XX XXXXX      " ! --3 -- 3
"1 1 0 0 0 0 0 0 0 0 1 1 0 0 ZZZZZZZZZZZZZZZZZZZZZZZZZZZZZZZ
ZZZZZZZZZZZZZZZZZZZZZZZZZZZZZZZ ZZZZZZZZZZZZZZZZZZZ
ZZZZZZZZZZZZZZZZZZZZZZZZZZZZZZZ ZZZZZZZZZZZZZZZZZZZZZZZZZZZ    XXXXXXXXXXXXX
XXXXXXXXXXXXXX XXXXXXXXX XX XX XXXXX      " ! --3 -- 3
"0 1 0 0 0 0 0 0 0 0 1 1 1 0 ZZZZZZZZZZZZZZZZZZZZZZZZZZZZZZZ
ZZZZZZZZZZZZZZZZZZZZZZZZZZZZZZZ ZZZZZZZZZZZZZZZZZZZ
ZZZZZZZZZZZZZZZZZZZZZZZZZZZZZZZ ZZZZZZZZZZZZZZZZZZZZZZZZZZZ    XXXXXXXXXXXXX
XXXXXXXXXXXXXX XXXXXXXXX XX XX XXXXX      " ! --4 -- 4
"1 1 0 0 0 0 0 0 0 0 1 1 1 0 ZZZZZZZZZZZZZZZZZZZZZZZZZZZZZZZ
ZZZZZZZZZZZZZZZZZZZZZZZZZZZZZZZ ZZZZZZZZZZZZZZZZZZZ
ZZZZZZZZZZZZZZZZZZZZZZZZZZZZZZZ ZZZZZZZZZZZZZZZZZZZZZZZZZZZ    XXXXXXXXXXXXX
XXXXXXXXXXXXXX XXXXXXXXX XX XX XXXXX      " ! --4 -- 4
"0 1 0 0 0 0 0 0 0 0 1 1 1 0 ZZZZZZZZZZZZZZZZZZZZZZZZZZZZZZZ
ZZZZZZZZZZZZZZZZZZZZZZZZZZZZZZZ ZZZZZZZZZZZZZZZZZZZ
ZZZZZZZZZZZZZZZZZZZZZZZZZZZZZZZ ZZZZZZZZZZZZZZZZZZZZZZZZZZZ    XXXXXXXXXXXXX
XXXXXXXXXXXXXX XXXXXXXXX XX XX XXXXX      " ! --5 -- 5
"1 1 0 0 0 0 0 0 0 0 1 1 1 0 ZZZZZZZZZZZZZZZZZZZZZZZZZZZZZZZ
ZZZZZZZZZZZZZZZZZZZZZZZZZZZZZZZ ZZZZZZZZZZZZZZZZZZZ
```

USYS-0051                           34                          PATENT
                                                                TN/142

```
        ZZZZZZZZZZZZZZZZZZZZZZZZZZZZZZZZ ZZZZZZZZZZZZZZZZZZZZZZZZ  XXXXXXXXXXXXX
        XXXXXXXXXXXXX XXXXXXXXX XX XX XXXXX      " !  --5 -- 5
        "0 1 0 0 0 0 0 0 0 0 1 1 1 0 ZZZZZZZZZZZZZZZZZZZZZZZZZZZZZZ
        ZZZZZZZZZZZZZZZZZZZZZZZZZZZZZZZZ ZZZZZZZZZZZZZZZZZZZZZZZZ
 5      ZZZZZZZZZZZZZZZZZZZZZZZZZZZZZZZZ ZZZZZZZZZZZZZZZZZZZZZZZZ  XXXXXXXXXXXXX
        XXXXXXXXXXXXX XXXXXXXXX XX XX XXXXX      " !  Loop 7 Times --6 -- 6
        "1 1 0 0 0 0 0 0 0 0 1 1 1 0 ZZZZZZZZZZZZZZZZZZZZZZZZZZZZZZ
        ZZZZZZZZZZZZZZZZZZZZZZZZZZZZZZZZ ZZZZZZZZZZZZZZZZZZZZZZZZ
        ZZZZZZZZZZZZZZZZZZZZZZZZZZZZZZZZ ZZZZZZZZZZZZZZZZZZZZZZZZ  XXXXXXXXXXXXX
10      XXXXXXXXXXXXX XXXXXXXXX XX XX XXXXX      " !  Loop 7 Times --6 -- 6
        "0 1 0 0 0 0 0 0 0 0 1 1 0 0 ZZZZZZZZZZZZZZZZZZZZZZZZZZZZZZ
        ZZZZZZZZZZZZZZZZZZZZZZZZZZZZZZZZ ZZZZZZZZZZZZZZZZZZZZZZZZ
        ZZZZZZZZZZZZZZZZZZZZZZZZZZZZZZZZ ZZZZZZZZZZZZZZZZZZZZZZZZ  XXXXXXXXXXXXX
        XXXXXXXXXXXXX XXXXXXXXX XX XX XXXXX      " !  End Loop --7 -- 7
15      "1 1 0 0 0 0 0 0 0 0 1 1 0 0 ZZZZZZZZZZZZZZZZZZZZZZZZZZZZZZ
        ZZZZZZZZZZZZZZZZZZZZZZZZZZZZZZZZ ZZZZZZZZZZZZZZZZZZZZZZZZ
        ZZZZZZZZZZZZZZZZZZZZZZZZZZZZZZZZ ZZZZZZZZZZZZZZZZZZZZZZZZ  XXXXXXXXXXXXX
        XXXXXXXXXXXXX XXXXXXXXX XX XX XXXXX      " !  End Loop --7 -- 7
        "0 1 0 0 0 0 0 0 0 0 1 1 1 0 ZZZZZZZZZZZZZZZZZZZZZZZZZZZZZZ
20      ZZZZZZZZZZZZZZZZZZZZZZZZZZZZZZZZ ZZZZZZZZZZZZZZZZZZZZZZZZ
        ZZZZZZZZZZZZZZZZZZZZZZZZZZZZZZZZ ZZZZZZZZZZZZZZZZZZZZZZZZ  XXXXXXXXXXXXX
        XXXXXXXXXXXXX XXXXXXXXX XX XX XXXXX      " !  Loop 7 Times --6 -- 8
        "1 1 0 0 0 0 0 0 0 0 1 1 1 0 ZZZZZZZZZZZZZZZZZZZZZZZZZZZZZZ
        ZZZZZZZZZZZZZZZZZZZZZZZZZZZZZZZZ ZZZZZZZZZZZZZZZZZZZZZZZZ
25      ZZZZZZZZZZZZZZZZZZZZZZZZZZZZZZZZ ZZZZZZZZZZZZZZZZZZZZZZZZ  XXXXXXXXXXXXX
        XXXXXXXXXXXXX XXXXXXXXX XX XX XXXXX      " !  Loop 7 Times --6 -- 8
        "0 1 0 0 0 0 0 0 0 0 1 1 0 0 ZZZZZZZZZZZZZZZZZZZZZZZZZZZZZZ
        ZZZZZZZZZZZZZZZZZZZZZZZZZZZZZZZZ ZZZZZZZZZZZZZZZZZZZZZZZZ
        ZZZZZZZZZZZZZZZZZZZZZZZZZZZZZZZZ ZZZZZZZZZZZZZZZZZZZZZZZZ  XXXXXXXXXXXXX
30      XXXXXXXXXXXXX XXXXXXXXX XX XX XXXXX      " !  End Loop --7 -- 9
        "1 1 0 0 0 0 0 0 0 0 1 1 0 0 ZZZZZZZZZZZZZZZZZZZZZZZZZZZZZZ
        ZZZZZZZZZZZZZZZZZZZZZZZZZZZZZZZZ ZZZZZZZZZZZZZZZZZZZZZZZZ
        ZZZZZZZZZZZZZZZZZZZZZZZZZZZZZZZZ ZZZZZZZZZZZZZZZZZZZZZZZZ  XXXXXXXXXXXXX
        XXXXXXXXXXXXX XXXXXXXXX XX XX XXXXX      " !  End Loop --7 -- 9
35      "0 1 0 0 0 0 0 0 0 0 1 1 1 0 ZZZZZZZZZZZZZZZZZZZZZZZZZZZZZZ
        ZZZZZZZZZZZZZZZZZZZZZZZZZZZZZZZZ ZZZZZZZZZZZZZZZZZZZZZZZZ
        ZZZZZZZZZZZZZZZZZZZZZZZZZZZZZZZZ ZZZZZZZZZZZZZZZZZZZZZZZZ  XXXXXXXXXXXXX
        XXXXXXXXXXXXX XXXXXXXXX XX XX XXXXX      " !  Loop 7 Times --6 -- 10
        "1 1 0 0 0 0 0 0 0 0 1 1 1 0 ZZZZZZZZZZZZZZZZZZZZZZZZZZZZZZ
40      ZZZZZZZZZZZZZZZZZZZZZZZZZZZZZZZZ ZZZZZZZZZZZZZZZZZZZZZZZZ
        ZZZZZZZZZZZZZZZZZZZZZZZZZZZZZZZZ ZZZZZZZZZZZZZZZZZZZZZZZZ  XXXXXXXXXXXXX
        XXXXXXXXXXXXX XXXXXXXXX XX XX XXXXX      " !  Loop 7 Times --6 -- 10
        "0 1 0 0 0 0 0 0 0 0 1 1 0 0 ZZZZZZZZZZZZZZZZZZZZZZZZZZZZZZ
        ZZZZZZZZZZZZZZZZZZZZZZZZZZZZZZZZ ZZZZZZZZZZZZZZZZZZZZZZZZ
45      ZZZZZZZZZZZZZZZZZZZZZZZZZZZZZZZZ ZZZZZZZZZZZZZZZZZZZZZZZZ  XXXXXXXXXXXXX
        XXXXXXXXXXXXX XXXXXXXXX XX XX XXXXX      " !  End Loop --7 -- 11
        "1 1 0 0 0 0 0 0 0 0 1 1 0 0 ZZZZZZZZZZZZZZZZZZZZZZZZZZZZZZ
        ZZZZZZZZZZZZZZZZZZZZZZZZZZZZZZZZ ZZZZZZZZZZZZZZZZZZZZZZZZ
        ZZZZZZZZZZZZZZZZZZZZZZZZZZZZZZZZ ZZZZZZZZZZZZZZZZZZZZZZZZ  XXXXXXXXXXXXX
50      XXXXXXXXXXXXX XXXXXXXXX XX XX XXXXX      " !  End Loop --7 -- 11
        "0 1 0 0 0 0 0 0 0 0 1 1 1 0 ZZZZZZZZZZZZZZZZZZZZZZZZZZZZZZ
        ZZZZZZZZZZZZZZZZZZZZZZZZZZZZZZZZ ZZZZZZZZZZZZZZZZZZZZZZZZ
        ZZZZZZZZZZZZZZZZZZZZZZZZZZZZZZZZ ZZZZZZZZZZZZZZZZZZZZZZZZ  XXXXXXXXXXXXX
        XXXXXXXXXXXXX XXXXXXXXX XX XX XXXXX      " !  Loop 7 Times --6 -- 12
55      "1 1 0 0 0 0 0 0 0 0 1 1 1 0 ZZZZZZZZZZZZZZZZZZZZZZZZZZZZZZ
        ZZZZZZZZZZZZZZZZZZZZZZZZZZZZZZZZ ZZZZZZZZZZZZZZZZZZZZZZZZ
        ZZZZZZZZZZZZZZZZZZZZZZZZZZZZZZZZ ZZZZZZZZZZZZZZZZZZZZZZZZ  XXXXXXXXXXXXX
        XXXXXXXXXXXXX XXXXXXXXX XX XX XXXXX      " !  Loop 7 Times --6 -- 12
        "0 1 0 0 0 0 0 0 0 0 1 1 0 0 ZZZZZZZZZZZZZZZZZZZZZZZZZZZZZZ
60      ZZZZZZZZZZZZZZZZZZZZZZZZZZZZZZZZ ZZZZZZZZZZZZZZZZZZZZZZZZ
```

USYS-0051                                35                          PATENT
                                                                     TN/142

```
     ZZZZZZZZZZZZZZZZZZZZZZZZZZZZZZZZ ZZZZZZZZZZZZZZZZZZZZZZZZ  XXXXXXXXXXXXX
     XXXXXXXXXXXXX XXXXXXXXX XX XX XXXXX      " ! End Loop --7 -- 13
     "1 1 0 0 0 0 0 0 0 0 0 1 1 0 0 ZZZZZZZZZZZZZZZZZZZZZZZZZZZZZZZZ
     ZZZZZZZZZZZZZZZZZZZZZZZZZZZZZZZZ ZZZZZZZZZZZZZZZZZZZZZZZZ
 5   ZZZZZZZZZZZZZZZZZZZZZZZZZZZZZZZZ ZZZZZZZZZZZZZZZZZZZZZZZZ  XXXXXXXXXXXXX
     XXXXXXXXXXXXX XXXXXXXXX XX XX XXXXX      " ! End Loop --7 -- 13
     "0 1 0 0 0 0 0 0 0 0 0 1 1 1 0 ZZZZZZZZZZZZZZZZZZZZZZZZZZZZZZZZ
     ZZZZZZZZZZZZZZZZZZZZZZZZZZZZZZZZ ZZZZZZZZZZZZZZZZZZZZZZZZ
     ZZZZZZZZZZZZZZZZZZZZZZZZZZZZZZZZ ZZZZZZZZZZZZZZZZZZZZZZZZ  XXXXXXXXXXXXX
10   XXXXXXXXXXXXX XXXXXXXXX XX XX XXXXX      " ! Loop 7 Times --6 -- 14
     "1 1 0 0 0 0 0 0 0 0 0 1 1 1 0 ZZZZZZZZZZZZZZZZZZZZZZZZZZZZZZZZ
     ZZZZZZZZZZZZZZZZZZZZZZZZZZZZZZZZ ZZZZZZZZZZZZZZZZZZZZZZZZ
     ZZZZZZZZZZZZZZZZZZZZZZZZZZZZZZZZ ZZZZZZZZZZZZZZZZZZZZZZZZ  XXXXXXXXXXXXX
     XXXXXXXXXXXXX XXXXXXXXX XX XX XXXXX      " ! Loop 7 Times --6 -- 14
15   "0 1 0 0 0 0 0 0 0 0 0 1 1 0 0 ZZZZZZZZZZZZZZZZZZZZZZZZZZZZZZZZ
     ZZZZZZZZZZZZZZZZZZZZZZZZZZZZZZZZ ZZZZZZZZZZZZZZZZZZZZZZZZ
     ZZZZZZZZZZZZZZZZZZZZZZZZZZZZZZZZ ZZZZZZZZZZZZZZZZZZZZZZZZ  XXXXXXXXXXXXX
     XXXXXXXXXXXXX XXXXXXXXX XX XX XXXXX      " ! End Loop --7 -- 15
     "1 1 0 0 0 0 0 0 0 0 0 1 1 0 0 ZZZZZZZZZZZZZZZZZZZZZZZZZZZZZZZZ
20   ZZZZZZZZZZZZZZZZZZZZZZZZZZZZZZZZ ZZZZZZZZZZZZZZZZZZZZZZZZ
     ZZZZZZZZZZZZZZZZZZZZZZZZZZZZZZZZ ZZZZZZZZZZZZZZZZZZZZZZZZ  XXXXXXXXXXXXX
     XXXXXXXXXXXXX XXXXXXXXX XX XX XXXXX      " ! End Loop --7 -- 15
     "0 1 0 0 0 0 0 0 0 0 0 1 1 1 0 ZZZZZZZZZZZZZZZZZZZZZZZZZZZZZZZZ
     ZZZZZZZZZZZZZZZZZZZZZZZZZZZZZZZZ ZZZZZZZZZZZZZZZZZZZZZZZZ
25   ZZZZZZZZZZZZZZZZZZZZZZZZZZZZZZZZ ZZZZZZZZZZZZZZZZZZZZZZZZ  XXXXXXXXXXXXX
     XXXXXXXXXXXXX XXXXXXXXX XX XX XXXXX      " ! Loop 7 Times --6 -- 16
     "1 1 0 0 0 0 0 0 0 0 0 1 1 1 0 ZZZZZZZZZZZZZZZZZZZZZZZZZZZZZZZZ
     ZZZZZZZZZZZZZZZZZZZZZZZZZZZZZZZZ ZZZZZZZZZZZZZZZZZZZZZZZZ
     ZZZZZZZZZZZZZZZZZZZZZZZZZZZZZZZZ ZZZZZZZZZZZZZZZZZZZZZZZZ  XXXXXXXXXXXXX
30   XXXXXXXXXXXXX XXXXXXXXX XX XX XXXXX      " ! Loop 7 Times --6 -- 16
     "0 1 0 0 0 0 0 0 0 0 0 1 1 0 0 ZZZZZZZZZZZZZZZZZZZZZZZZZZZZZZZZ
     ZZZZZZZZZZZZZZZZZZZZZZZZZZZZZZZZ ZZZZZZZZZZZZZZZZZZZZZZZZ
     ZZZZZZZZZZZZZZZZZZZZZZZZZZZZZZZZ ZZZZZZZZZZZZZZZZZZZZZZZZ  XXXXXXXXXXXXX
     XXXXXXXXXXXXX XXXXXXXXX XX XX XXXXX      " ! End Loop --7 -- 17
35   "1 1 0 0 0 0 0 0 0 0 0 1 1 0 0 ZZZZZZZZZZZZZZZZZZZZZZZZZZZZZZZZ
     ZZZZZZZZZZZZZZZZZZZZZZZZZZZZZZZZ ZZZZZZZZZZZZZZZZZZZZZZZZ
     ZZZZZZZZZZZZZZZZZZZZZZZZZZZZZZZZ ZZZZZZZZZZZZZZZZZZZZZZZZ  XXXXXXXXXXXXX
     XXXXXXXXXXXXX XXXXXXXXX XX XX XXXXX      " ! End Loop --7 -- 17
     "0 1 0 0 0 0 0 0 0 0 0 1 1 1 0 ZZZZZZZZZZZZZZZZZZZZZZZZZZZZZZZZ
40   ZZZZZZZZZZZZZZZZZZZZZZZZZZZZZZZZ ZZZZZZZZZZZZZZZZZZZZZZZZ
     ZZZZZZZZZZZZZZZZZZZZZZZZZZZZZZZZ ZZZZZZZZZZZZZZZZZZZZZZZZ  XXXXXXXXXXXXX
     XXXXXXXXXXXXX XXXXXXXXX XX XX XXXXX      " ! Loop 7 Times --6 -- 18
     "1 1 0 0 0 0 0 0 0 0 0 1 1 1 0 ZZZZZZZZZZZZZZZZZZZZZZZZZZZZZZZZ
     ZZZZZZZZZZZZZZZZZZZZZZZZZZZZZZZZ ZZZZZZZZZZZZZZZZZZZZZZZZ
45   ZZZZZZZZZZZZZZZZZZZZZZZZZZZZZZZZ ZZZZZZZZZZZZZZZZZZZZZZZZ  XXXXXXXXXXXXX
     XXXXXXXXXXXXX XXXXXXXXX XX XX XXXXX      " ! Loop 7 Times --6 -- 18
     "0 1 0 0 0 0 0 0 0 0 0 1 1 0 0 ZZZZZZZZZZZZZZZZZZZZZZZZZZZZZZZZ
     ZZZZZZZZZZZZZZZZZZZZZZZZZZZZZZZZ ZZZZZZZZZZZZZZZZZZZZZZZZ
     ZZZZZZZZZZZZZZZZZZZZZZZZZZZZZZZZ ZZZZZZZZZZZZZZZZZZZZZZZZ  XXXXXXXXXXXXX
50   XXXXXXXXXXXXX XXXXXXXXX XX XX XXXXX      " ! End Loop --7 -- 19
     "1 1 0 0 0 0 0 0 0 0 0 1 1 0 0 ZZZZZZZZZZZZZZZZZZZZZZZZZZZZZZZZ
     ZZZZZZZZZZZZZZZZZZZZZZZZZZZZZZZZ ZZZZZZZZZZZZZZZZZZZZZZZZ
     ZZZZZZZZZZZZZZZZZZZZZZZZZZZZZZZZ ZZZZZZZZZZZZZZZZZZZZZZZZ  XXXXXXXXXXXXX
     XXXXXXXXXXXXX XXXXXXXXX XX XX XXXXX      " ! End Loop --7 -- 19
55   "1 1 0 0 0 0 0 0 0 0 0 1 1 0 0 ZZZZZZZZZZZZZZZZZZZZZZZZZZZZZZZZ
     ZZZZZZZZZZZZZZZZZZZZZZZZZZZZZZZZ ZZZZZZZZZZZZZZZZZZZZZZZZ
     ZZZZZZZZZZZZZZZZZZZZZZZZZZZZZZZZ ZZZZZZZZZZZZZZZZZZZZZZZZ  XXXXXXXXXXXXX
     XXXXXXXXXXXXX XXHXXXXXXX XX XX XXXXX      " ! --8 -- 20
     "0 1 0 0 0 0 0 0 0 0 0 1 1 0 0 ZZZZZZZZZZZZZZZZZZZZZZZZZZZZZZZZ
60   ZZZZZZZZZZZZZZZZZZZZZZZZZZZZZZZZ ZZZZZZZZZZZZZZZZZZZZZZZZ
```

USYS-0051                               36                              PATENT
                                                                        TN/142

```
        ZZZZZZZZZZZZZZZZZZZZZZZZZZZZZZZZZ  ZZZZZZZZZZZZZZZZZZZZZZZZ  XXXXXXXXXXXXX
        XXXXXXXXXXXXXX XXHXXXXXXX XX XX XXXXX        " ! --9 -- 21
        "1 1 0 0 0 0 0 0 0 0 0 1 1 0 0 ZZZZZZZZZZZZZZZZZZZZZZZZZZZZZZZZZ
        ZZZZZZZZZZZZZZZZZZZZZZZZZZZZZZZZZ  ZZZZZZZZZZZZZZZZZZZZZZZZ
 5      ZZZZZZZZZZZZZZZZZZZZZZZZZZZZZZZZZ  ZZZZZZZZZZZZZZZZZZZZZZZZ  XXXXXXXXXXXXX
        XXXXXXXXXXXXXX XXHXXXXXXX XX XX XXXXX        " ! --9 -- 21
        "0 1 0 0 0 0 0 0 0 0 0 1 1 0 0 ZZZZZZZZZZZZZZZZZZZZZZZZZZZZZZZZZ
        ZZZZZZZZZZZZZZZZZZZZZZZZZZZZZZZZZ  ZZZZZZZZZZZZZZZZZZZZZZZZ
        ZZZZZZZZZZZZZZZZZZZZZZZZZZZZZZZZZ  ZZZZZZZZZZZZZZZZZZZZZZZZ  XXXXXXXXXXXXX
10      XXXXXXXXXXXXXX XXLXXXXXXX XX XX XXXXX        " ! --10 -- 22
        "1 1 0 0 0 0 0 0 0 0 0 1 1 0 0 ZZZZZZZZZZZZZZZZZZZZZZZZZZZZZZZZZ
        ZZZZZZZZZZZZZZZZZZZZZZZZZZZZZZZZZ  ZZZZZZZZZZZZZZZZZZZZZZZZ
        ZZZZZZZZZZZZZZZZZZZZZZZZZZZZZZZZZ  ZZZZZZZZZZZZZZZZZZZZZZZZ  XXXXXXXXXXXXX
        XXXXXXXXXXXXXX XXLXXXXXXX XX XX XXXXX        " ! --10 -- 22
15      "0 1 0 0 0 0 0 0 0 0 0 1 1 0 0 ZZZZZZZZZZZZZZZZZZZZZZZZZZZZZZZZZ
        ZZZZZZZZZZZZZZZZZZZZZZZZZZZZZZZZZ  ZZZZZZZZZZZZZZZZZZZZZZZZ
        ZZZZZZZZZZZZZZZZZZZZZZZZZZZZZZZZZ  ZZZZZZZZZZZZZZZZZZZZZZZZ  XXXXXXXXXXXXX
        XXXXXXXXXXXXXX XXHXXXXXXX XX XX XXXXX        " ! --11 -- 23
20      "1 1 0 0 0 0 0 0 0 0 0 1 1 0 0 ZZZZZZZZZZZZZZZZZZZZZZZZZZZZZZZZZ
        ZZZZZZZZZZZZZZZZZZZZZZZZZZZZZZZZZ  ZZZZZZZZZZZZZZZZZZZZZZZZ
        ZZZZZZZZZZZZZZZZZZZZZZZZZZZZZZZZZ  ZZZZZZZZZZZZZZZZZZZZZZZZ  XXXXXXXXXXXXX
        XXXXXXXXXXXXXX XXHXXXXXXX XX XX XXXXX        " ! --11 -- 23
        "0 1 0 0 0 0 0 0 0 0 0 1 1 0 0 ZZZZZZZZZZZZZZZZZZZZZZZZZZZZZZZZZ
25      ZZZZZZZZZZZZZZZZZZZZZZZZZZZZZZZZZ  ZZZZZZZZZZZZZZZZZZZZZZZZ
        ZZZZZZZZZZZZZZZZZZZZZZZZZZZZZZZZZ  ZZZZZZZZZZZZZZZZZZZZZZZZ  XXXXXXXXXXXXX
        XXXXXXXXXXXXXX XXHXXXXXXX XX XX XXXXX        " ! --12 -- 24
        "1 1 0 0 0 0 0 0 0 0 0 1 1 0 0 ZZZZZZZZZZZZZZZZZZZZZZZZZZZZZZZZZ
        ZZZZZZZZZZZZZZZZZZZZZZZZZZZZZZZZZ  ZZZZZZZZZZZZZZZZZZZZZZZZ
30      ZZZZZZZZZZZZZZZZZZZZZZZZZZZZZZZZZ  ZZZZZZZZZZZZZZZZZZZZZZZZ  XXXXXXXXXXXXX
        XXXXXXXXXXXXXX XXHXXXXXXX XX XX XXXXX        " ! --12 -- 24
        "0 1 0 0 0 0 0 0 0 0 0 1 1 0 0 ZZZZZZZZZZZZZZZZZZZZZZZZZZZZZZZZZ
        ZZZZZZZZZZZZZZZZZZZZZZZZZZZZZZZZZ  ZZZZZZZZZZZZZZZZZZZZZZZZ
        ZZZZZZZZZZZZZZZZZZZZZZZZZZZZZZZZZ  ZZZZZZZZZZZZZZZZZZZZZZZZ  XXXXXXXXXXXXX
        XXXXXXXXXXXXXX XXHXXXXXXX XX XX XXXXX        " ! Loop 7 Times --13 -- 25
35      "1 1 0 0 0 0 0 0 0 0 0 1 1 0 0 ZZZZZZZZZZZZZZZZZZZZZZZZZZZZZZZZZ
        ZZZZZZZZZZZZZZZZZZZZZZZZZZZZZZZZZ  ZZZZZZZZZZZZZZZZZZZZZZZZ
        ZZZZZZZZZZZZZZZZZZZZZZZZZZZZZZZZZ  ZZZZZZZZZZZZZZZZZZZZZZZZ  XXXXXXXXXXXXX
        XXXXXXXXXXXXXX XXHXXXXXXX XX XX XXXXX        " ! Loop 7 Times --13 -- 25
        "0 1 0 0 0 0 0 0 0 0 0 1 1 0 0 ZZZZZZZZZZZZZZZZZZZZZZZZZZZZZZZZZ
40      ZZZZZZZZZZZZZZZZZZZZZZZZZZZZZZZZZ  ZZZZZZZZZZZZZZZZZZZZZZZZ
        ZZZZZZZZZZZZZZZZZZZZZZZZZZZZZZZZZ  ZZZZZZZZZZZZZZZZZZZZZZZZ  XXXXXXXXXXXXX
        XXXXXXXXXXXXXX XXLXXXXXXX XX XX XXXXX        " ! End Loop --14 -- 26
        "1 1 0 0 0 0 0 0 0 0 0 1 1 0 0 ZZZZZZZZZZZZZZZZZZZZZZZZZZZZZZZZZ
        ZZZZZZZZZZZZZZZZZZZZZZZZZZZZZZZZZ  ZZZZZZZZZZZZZZZZZZZZZZZZ
45      ZZZZZZZZZZZZZZZZZZZZZZZZZZZZZZZZZ  ZZZZZZZZZZZZZZZZZZZZZZZZ  XXXXXXXXXXXXX
        XXXXXXXXXXXXXX XXLXXXXXXX XX XX XXXXX        " ! End Loop --14 -- 26
        "0 1 0 0 0 0 0 0 0 0 0 1 1 0 0 ZZZZZZZZZZZZZZZZZZZZZZZZZZZZZZZZZ
        ZZZZZZZZZZZZZZZZZZZZZZZZZZZZZZZZZ  ZZZZZZZZZZZZZZZZZZZZZZZZ
        ZZZZZZZZZZZZZZZZZZZZZZZZZZZZZZZZZ  ZZZZZZZZZZZZZZZZZZZZZZZZ  XXXXXXXXXXXXX
50      XXXXXXXXXXXXXX XXHXXXXXXX XX XX XXXXX        " ! Loop 7 Times --13 -- 27
        "1 1 0 0 0 0 0 0 0 0 0 1 1 0 0 ZZZZZZZZZZZZZZZZZZZZZZZZZZZZZZZZZ
        ZZZZZZZZZZZZZZZZZZZZZZZZZZZZZZZZZ  ZZZZZZZZZZZZZZZZZZZZZZZZ
        ZZZZZZZZZZZZZZZZZZZZZZZZZZZZZZZZZ  ZZZZZZZZZZZZZZZZZZZZZZZZ  XXXXXXXXXXXXX
        XXXXXXXXXXXXXX XXHXXXXXXX XX XX XXXXX        " ! Loop 7 Times --13 -- 27
55      "0 1 0 0 0 0 0 0 0 0 0 1 1 0 0 ZZZZZZZZZZZZZZZZZZZZZZZZZZZZZZZZZ
        ZZZZZZZZZZZZZZZZZZZZZZZZZZZZZZZZZ  ZZZZZZZZZZZZZZZZZZZZZZZZ
        ZZZZZZZZZZZZZZZZZZZZZZZZZZZZZZZZZ  ZZZZZZZZZZZZZZZZZZZZZZZZ  XXXXXXXXXXXXX
        XXXXXXXXXXXXXX XXLXXXXXXX XX XX XXXXX        " ! End Loop --14 -- 28
        "1 1 0 0 0 0 0 0 0 0 0 1 1 0 0 ZZZZZZZZZZZZZZZZZZZZZZZZZZZZZZZZZ
60      ZZZZZZZZZZZZZZZZZZZZZZZZZZZZZZZZZ  ZZZZZZZZZZZZZZZZZZZZZZZZ
```

```
          ZZZZZZZZZZZZZZZZZZZZZZZZZZZZZZ ZZZZZZZZZZZZZZZZZZZZZZZZ XXXXXXXXXXXXX
          XXXXXXXXXXXXX XXLXXXXXXX XX XX XXXXX       " !  End Loop --14 -- 28
          "0 1 0 0 0 0 0 0 0 0 1 1 0 0 ZZZZZZZZZZZZZZZZZZZZZZZZZZZZZZ
          ZZZZZZZZZZZZZZZZZZZZZZZZZZZZZZ ZZZZZZZZZZZZZZZZZZZZZZZZ
    5     ZZZZZZZZZZZZZZZZZZZZZZZZZZZZZZ ZZZZZZZZZZZZZZZZZZZZZZZZ XXXXXXXXXXXXX
          XXXXXXXXXXXXX XXHXXXXXXX XX XX XXXXX       " !  Loop 7 Times --13 -- 29
          "1 1 0 0 0 0 0 0 0 0 1 1 0 0 ZZZZZZZZZZZZZZZZZZZZZZZZZZZZZZ
          ZZZZZZZZZZZZZZZZZZZZZZZZZZZZZZ ZZZZZZZZZZZZZZZZZZZZZZZZ
          ZZZZZZZZZZZZZZZZZZZZZZZZZZZZZZ ZZZZZZZZZZZZZZZZZZZZZZZZ XXXXXXXXXXXXX
   10     XXXXXXXXXXXXX XXHXXXXXXX XX XX XXXXX       " !  Loop 7 Times --13 -- 29
          "0 1 0 0 0 0 0 0 0 0 1 1 0 0 ZZZZZZZZZZZZZZZZZZZZZZZZZZZZZZ
          ZZZZZZZZZZZZZZZZZZZZZZZZZZZZZZ ZZZZZZZZZZZZZZZZZZZZZZZZ
          ZZZZZZZZZZZZZZZZZZZZZZZZZZZZZZ ZZZZZZZZZZZZZZZZZZZZZZZZ XXXXXXXXXXXXX
          XXXXXXXXXXXXX XXLXXXXXXX XX XX XXXXX       " !  End Loop --14 -- 30
   15     "1 1 0 0 0 0 0 0 0 0 1 1 0 0 ZZZZZZZZZZZZZZZZZZZZZZZZZZZZZZ
          ZZZZZZZZZZZZZZZZZZZZZZZZZZZZZZ ZZZZZZZZZZZZZZZZZZZZZZZZ
          ZZZZZZZZZZZZZZZZZZZZZZZZZZZZZZ ZZZZZZZZZZZZZZZZZZZZZZZZ XXXXXXXXXXXXX
          XXXXXXXXXXXXX XXLXXXXXXX XX XX XXXXX       " !  End Loop --14 -- 30
          "0 1 0 0 0 0 0 0 0 0 1 1 0 0 ZZZZZZZZZZZZZZZZZZZZZZZZZZZZZZ
   20     ZZZZZZZZZZZZZZZZZZZZZZZZZZZZZZ ZZZZZZZZZZZZZZZZZZZZZZZZ
          ZZZZZZZZZZZZZZZZZZZZZZZZZZZZZZ ZZZZZZZZZZZZZZZZZZZZZZZZ XXXXXXXXXXXXX
          XXXXXXXXXXXXX XXHXXXXXXX XX XX XXXXX       " !  Loop 7 Times --13 -- 31
          "1 1 0 0 0 0 0 0 0 0 1 1 0 0 ZZZZZZZZZZZZZZZZZZZZZZZZZZZZZZ
          ZZZZZZZZZZZZZZZZZZZZZZZZZZZZZZ ZZZZZZZZZZZZZZZZZZZZZZZZ
   25     ZZZZZZZZZZZZZZZZZZZZZZZZZZZZZZ ZZZZZZZZZZZZZZZZZZZZZZZZ XXXXXXXXXXXXX
          XXXXXXXXXXXXX XXHXXXXXXX XX XX XXXXX       " !  Loop 7 Times --13 -- 31
          "0 1 0 0 0 0 0 0 0 0 1 1 0 0 ZZZZZZZZZZZZZZZZZZZZZZZZZZZZZZ
          ZZZZZZZZZZZZZZZZZZZZZZZZZZZZZZ ZZZZZZZZZZZZZZZZZZZZZZZZ
          ZZZZZZZZZZZZZZZZZZZZZZZZZZZZZZ ZZZZZZZZZZZZZZZZZZZZZZZZ XXXXXXXXXXXXX
   30     XXXXXXXXXXXXX XXLXXXXXXX XX XX XXXXX       " !  End Loop --14 -- 32
          "1 1 0 0 0 0 0 0 0 0 1 1 0 0 ZZZZZZZZZZZZZZZZZZZZZZZZZZZZZZ
          ZZZZZZZZZZZZZZZZZZZZZZZZZZZZZZ ZZZZZZZZZZZZZZZZZZZZZZZZ
          ZZZZZZZZZZZZZZZZZZZZZZZZZZZZZZ ZZZZZZZZZZZZZZZZZZZZZZZZ XXXXXXXXXXXXX
          XXXXXXXXXXXXX XXLXXXXXXX XX XX XXXXX       " !  End Loop --14 -- 32
   35     "0 1 0 0 0 0 0 0 0 0 1 1 0 0 ZZZZZZZZZZZZZZZZZZZZZZZZZZZZZZ
          ZZZZZZZZZZZZZZZZZZZZZZZZZZZZZZ ZZZZZZZZZZZZZZZZZZZZZZZZ
          ZZZZZZZZZZZZZZZZZZZZZZZZZZZZZZ ZZZZZZZZZZZZZZZZZZZZZZZZ XXXXXXXXXXXXX
          XXXXXXXXXXXXX XXHXXXXXXX XX XX XXXXX       " !  Loop 7 Times --13 -- 33
          "1 1 0 0 0 0 0 0 0 0 1 1 0 0 ZZZZZZZZZZZZZZZZZZZZZZZZZZZZZZ
   40     ZZZZZZZZZZZZZZZZZZZZZZZZZZZZZZ ZZZZZZZZZZZZZZZZZZZZZZZZ
          ZZZZZZZZZZZZZZZZZZZZZZZZZZZZZZ ZZZZZZZZZZZZZZZZZZZZZZZZ XXXXXXXXXXXXX
          XXXXXXXXXXXXX XXHXXXXXXX XX XX XXXXX       " !  Loop 7 Times --13 -- 33
          "0 1 0 0 0 0 0 0 0 0 1 1 0 0 ZZZZZZZZZZZZZZZZZZZZZZZZZZZZZZ
          ZZZZZZZZZZZZZZZZZZZZZZZZZZZZZZ ZZZZZZZZZZZZZZZZZZZZZZZZ
   45     ZZZZZZZZZZZZZZZZZZZZZZZZZZZZZZ ZZZZZZZZZZZZZZZZZZZZZZZZ XXXXXXXXXXXXX
          XXXXXXXXXXXXX XXLXXXXXXX XX XX XXXXX       " !  End Loop --14 -- 34
          "1 1 0 0 0 0 0 0 0 0 1 1 0 0 ZZZZZZZZZZZZZZZZZZZZZZZZZZZZZZ
          ZZZZZZZZZZZZZZZZZZZZZZZZZZZZZZ ZZZZZZZZZZZZZZZZZZZZZZZZ
          ZZZZZZZZZZZZZZZZZZZZZZZZZZZZZZ ZZZZZZZZZZZZZZZZZZZZZZZZ XXXXXXXXXXXXX
   50     XXXXXXXXXXXXX XXLXXXXXXX XX XX XXXXX       " !  End Loop --14 -- 34
          "0 1 0 0 0 0 0 0 0 0 1 1 0 0 ZZZZZZZZZZZZZZZZZZZZZZZZZZZZZZ
          ZZZZZZZZZZZZZZZZZZZZZZZZZZZZZZ ZZZZZZZZZZZZZZZZZZZZZZZZ
          ZZZZZZZZZZZZZZZZZZZZZZZZZZZZZZ ZZZZZZZZZZZZZZZZZZZZZZZZ XXXXXXXXXXXXX
          XXXXXXXXXXXXX XXHXXXXXXX XX XX XXXXX       " !  Loop 7 Times --13 -- 35
   55     "1 1 0 0 0 0 0 0 0 0 1 1 0 0 ZZZZZZZZZZZZZZZZZZZZZZZZZZZZZZ
          ZZZZZZZZZZZZZZZZZZZZZZZZZZZZZZ ZZZZZZZZZZZZZZZZZZZZZZZZ
          ZZZZZZZZZZZZZZZZZZZZZZZZZZZZZZ ZZZZZZZZZZZZZZZZZZZZZZZZ XXXXXXXXXXXXX
          XXXXXXXXXXXXX XXHXXXXXXX XX XX XXXXX       " !  Loop 7 Times --13 -- 35
          "0 1 0 0 0 0 0 0 0 0 1 1 0 0 ZZZZZZZZZZZZZZZZZZZZZZZZZZZZZZ
   60     ZZZZZZZZZZZZZZZZZZZZZZZZZZZZZZ ZZZZZZZZZZZZZZZZZZZZZZZZ
```

USYS-0051 38 PATENT
TN/142

```
    ZZZZZZZZZZZZZZZZZZZZZZZZZZZZZZ ZZZZZZZZZZZZZZZZZZZZ  XXXXXXXXXXXXX
    XXXXXXXXXXXXX XXLXXXXXXX XX XX XXXXX       " !  End Loop --14 -- 36
    "1 1 0 0 0 0 0 0 0 0 0 1 1 0 0 ZZZZZZZZZZZZZZZZZZZZZZZZZZZZZZZZZ
    ZZZZZZZZZZZZZZZZZZZZZZZZZZZZZZ ZZZZZZZZZZZZZZZZZZZ
 5  ZZZZZZZZZZZZZZZZZZZZZZZZZZZZZZ ZZZZZZZZZZZZZZZZZZZZ  XXXXXXXXXXXXX
    XXXXXXXXXXXXX XXLXXXXXXX XX XX XXXXX       " !  End Loop --14 -- 36
    "0 1 0 0 0 0 0 0 0 0 0 1 1 0 0 ZZZZZZZZZZZZZZZZZZZZZZZZZZZZZZZZZ
    ZZZZZZZZZZZZZZZZZZZZZZZZZZZZZZ ZZZZZZZZZZZZZZZZZZZ
    ZZZZZZZZZZZZZZZZZZZZZZZZZZZZZZ ZZZZZZZZZZZZZZZZZZZZ  XXXXXXXXXXXXX
10  XXXXXXXXXXXXX XXHXXXXXXX XX XX XXXXX       " !  Loop 7 Times --13 -- 37
    "1 1 0 0 0 0 0 0 0 0 0 1 1 0 0 ZZZZZZZZZZZZZZZZZZZZZZZZZZZZZZZZZ
    ZZZZZZZZZZZZZZZZZZZZZZZZZZZZZZ ZZZZZZZZZZZZZZZZZZZ
    ZZZZZZZZZZZZZZZZZZZZZZZZZZZZZZ ZZZZZZZZZZZZZZZZZZZZ  XXXXXXXXXXXXX
    XXXXXXXXXXXXX XXHXXXXXXX XX XX XXXXX       " !  Loop 7 Times --13 -- 37
15  "0 1 0 0 0 0 0 0 0 0 0 1 1 0 0 ZZZZZZZZZZZZZZZZZZZZZZZZZZZZZZZZZ
    ZZZZZZZZZZZZZZZZZZZZZZZZZZZZZZ ZZZZZZZZZZZZZZZZZZZ
    ZZZZZZZZZZZZZZZZZZZZZZZZZZZZZZ ZZZZZZZZZZZZZZZZZZZZ  XXXXXXXXXXXXX
    XXXXXXXXXXXXX XXLXXXXXXX XX XX XXXXX       " !  End Loop --14 -- 38
    "1 1 0 0 0 0 0 0 0 0 0 1 1 0 0 ZZZZZZZZZZZZZZZZZZZZZZZZZZZZZZZZZ
20  ZZZZZZZZZZZZZZZZZZZZZZZZZZZZZZ ZZZZZZZZZZZZZZZZZZZ
    ZZZZZZZZZZZZZZZZZZZZZZZZZZZZZZ ZZZZZZZZZZZZZZZZZZZZ  XXXXXXXXXXXXX
    XXXXXXXXXXXXX XXLXXXXXXX XX XX XXXXX       " !  End Loop --14 -- 38
    "0 0 0 0 0 0 0 0 0 0 0 0 0 0 Z ZZZZZZZZZZZZZZZZZZZZZZZZZZZZZZZZZ
    ZZZZZZZZZZZZZZZZZZZZZZZZZZZZZZ ZZZZZZZZZZZZZZZZZZZ
25  ZZZZZZZZZZZZZZZZZZZZZZZZZZZZZZ ZZZZZZZZZZZZZZZZZZZZ  XXXXXXXXXXXXX
    XXXXXXXXXXXXX XXXXXXXXXX XX XX XXXXX       " !  Halt --15 -- 39
    "1 0 0 0 0 0 0 0 0 0 0 0 0 0 Z ZZZZZZZZZZZZZZZZZZZZZZZZZZZZZZZZZ
    ZZZZZZZZZZZZZZZZZZZZZZZZZZZZZZ ZZZZZZZZZZZZZZZZZZZ
    ZZZZZZZZZZZZZZZZZZZZZZZZZZZZZZ ZZZZZZZZZZZZZZZZZZZZ  XXXXXXXXXXXXX
30  XXXXXXXXXXXXX XXXXXXXXXX XX XX XXXXX       " !  Halt --15 -- 39
    end pcf
    end unit
```

We claim:

1. A method for translating test vectors from a format suitable for use with an integrated circuit tester into a format suitable for use with an in-circuit tester, comprising:
   providing a first test file in a first format that is suitable for use with the integrated circuit tester for standalone testing of an integrated circuit;
   translating the first test file into a second test file in a second format that is suitable for use with the in-circuit tester for in-circuit testing of the integrated circuit, comprising the steps of:
      identifying in the first file, test vector data in the first format;
      identifying in the first file, pin information in the first format,
      writing to the second file, test vector data in the second format, the test vector data in the second format corresponding to the test vector data in the first format;
      writing to the second file, a plurality of pin data in the second format, the plurality of pin data based on the pin information.

2. The method of claim 1, wherein the first test file includes a set of test vectors for standalone testing of the integrated circuit.

3. The method of claim 1, wherein the first test file includes a set of pin definitions that define pins of the integrated circuit.

4. The method of claim 1, wherein the first test file is provided, at least in part, by
   providing a complete test file that includes test vectors for testing logic within the integrated circuit;
   selecting a subset of the test vectors included in the complete test file; and
   including the selected subset in the first test file.

5. The method of claim 1, wherein the plurality of pin data includes pin assignment statements, pin definitions, and pin functionality statements.

6. The method of claim 1, wherein the first format is IMS format.

7. The method of claim 1, wherein the second format is pattern conversion format.

8. A method for translating test vectors from a format suitable for use with an in-circuit tester into a format suitable for use with an integrated circuit tester, comprising:
   providing a first test file in a first format that is suitable for use with the in-circuit tester for in-circuit testing of an integrated circuit;
   translating the first test file into a second test file in a second format that is suitable for use with the integrated circuit tester for standalone testing of the integrated circuit, comprising the steps of:
      identifying in the first file, test vector data in the first format;
   identifying in the first file, pin information in the first format;
      writing to the second file, test vector data in the second format, the test vector data in the second format corresponding to the test vector data in the first format;
      writing to the second file, a plurality of pin data in the second format, the plurality of pin data based on the pin information.

9. The method of claim 8, wherein the first test file includes a set of test vectors for in-circuit testing of the integrated circuit.

10. The method of claim 8, wherein the first test file includes a set of pin definitions that define pins of the integrated circuit.

11. The method of claim 8, wherein the first test file is provided, at least in part, by
   providing a complete test file that includes test vectors for testing the integrated circuit in a completed printed circuit board assembly;
   selecting a subset of the test vectors included in the complete test file; and
   including the selected subset in the first test file.

12. The method of claim 8, wherein the plurality of pin data includes pin assignment statements, pin definitions, and pin functionally statements.

13. The method of claim 8, wherein the first format is pattern conversion format.

14. The method of claim 8, wherein the second format is IMS format.

15. A computer-readable medium having stored thereon computer-executable instructions for performing a method comprising:
   providing a first test file in a first format that is suitable for use with the integrated circuit tester for standalone testing of an integrated circuit;
   translating the first test file into a second test file in a second format that is suitable for use with the in-circuit tester for in-circuit testing of the integrated circuit, comprising the steps of:
      identifying in the first file, test vector data in the first format;
      identifying in the first file, pin information in the first format;
      writing to the second file, test vector data in the second format, the test vector data in the second format corresponding to the test vector data in the first format;
      writing to the second file, a plurality of pin data in the second format, the plurality of pin data based on the pin information.

16. A computer-readable medium having stored thereon computer-executable instructions for performing a method comprising:
   providing a first test file in a first format that is suitable for use with the in-circuit tester for in-circuit testing of an integrated circuit;
   translating the first test file into a second test file in a second format that is suitable for use with the integrated circuit tester for standalone testing of the integrated circuit, comprising the steps of:
      identifying in the first file, test vector data in the first format;
      identifying in the first file, pin information in the first format;
      writing to the second file, test vector data in the second format, the test vector data in the second format corresponding to the test vector data in the first format;
      writing to the second file, a plurality of pin data in the second format, the plurality of pin data based on the pin information.

* * * * *